United States Patent
Shim et al.

(10) Patent No.: US 10,134,756 B2
(45) Date of Patent: Nov. 20, 2018

(54) SEMICONDUCTOR DEVICE

(71) Applicants: Sun Il Shim, Seoul (KR); Seung Wook Choi, Suwon-si (KR)

(72) Inventors: Sun Il Shim, Seoul (KR); Seung Wook Choi, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/608,076

(22) Filed: May 30, 2017

(65) Prior Publication Data

US 2018/0166461 A1 Jun. 14, 2018

(30) Foreign Application Priority Data

Dec. 9, 2016 (KR) .................. 10-2016-0167745

(51) Int. Cl.
*H01L 29/792* (2006.01)
*H01L 27/11582* (2017.01)
*H01L 23/522* (2006.01)

(52) U.S. Cl.
CPC .... *H01L 27/11582* (2013.01); *H01L 23/5226* (2013.01)

(58) Field of Classification Search
USPC ....... 257/324, E29.309, E21.21; 365/185.05, 365/185.12, 185.18; 438/586, 666
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,171,859 B2 | 10/2015 | Oh et al. | |
| 9,337,198 B2* | 5/2016 | Kwon | H01L 27/1052 |
| 9,368,508 B2 | 6/2016 | Jee et al. | |
| 2010/0013049 A1 | 1/2010 | Tanaka et al. | |
| 2011/0233648 A1 | 9/2011 | Seol et al. | |
| 2015/0076579 A1 | 3/2015 | Tsuji et al. | |
| 2015/0309737 A1* | 10/2015 | Kim | G06F 3/0611 |
| | | | 711/103 |
| 2016/0049423 A1 | 2/2016 | Yoo et al. | |

(Continued)

FOREIGN PATENT DOCUMENTS

KR 101212709 12/2012

*Primary Examiner* — Tram H Nguyen
(74) *Attorney, Agent, or Firm* — Harness, Dickey & Pierce, P.L.C.

(57) ABSTRACT

A semiconductor device includes a plurality of cell gate electrodes on a semiconductor substrate. End portions of the cell gate electrodes include stepped-pad regions that extend in a direction parallel to a surface of the semiconductor substrate. Vertical structures are on the semiconductor substrate and pass through the plurality of cell gate electrodes. The vertical structures respectively include a channel layer. Upper peripheral transistors are disposed on the semiconductor substrate. The upper peripheral transistors include an upper peripheral gate electrode at a level higher than a level of the plurality of cell gate electrodes, body patterns passing through the upper peripheral gate electrode and electrically connected to the pad regions, and gate dielectric layers between the upper peripheral gate electrode and the body patterns.

20 Claims, 36 Drawing Sheets

(56) References Cited

U.S. PATENT DOCUMENTS

| | | | |
|---|---|---|---|
| 2016/0163386 A1* | 6/2016 | Hwang | G11C 5/025 365/185.12 |
| 2016/0163732 A1* | 6/2016 | Lim | H01L 27/11582 257/314 |
| 2016/0172296 A1* | 6/2016 | Lim | H01L 23/485 257/773 |
| 2016/0268304 A1* | 9/2016 | Ikeda | H01L 27/11582 |
| 2017/0084532 A1* | 3/2017 | Son | H01L 23/5226 |
| 2017/0125439 A1* | 5/2017 | Choi | H01L 23/5283 |
| 2017/0133399 A1* | 5/2017 | Kim | H01L 23/535 |
| 2017/0330894 A1* | 11/2017 | Lim | H01L 27/11573 |

\* cited by examiner

SEMICONDUCTOR DEVICE

CROSS-REFERENCE TO RELATED APPLICATION

This application claims benefit of priority to Korean Patent Application No. 10-2016-0167745 filed on Dec. 9, 2016 in the Korean Intellectual Property Office, the disclosure of which is incorporated herein by reference in its entirety.

BACKGROUND

1. Field

Inventive concepts relate to a semiconductor device.

2. Description of Related Art

In order to improve integration of a semiconductor device, a NAND flash device including word lines aligned in a direction perpendicular to a substrate has been developed.

SUMMARY

An aspect of inventive concepts provides a structure of a semiconductor device for improved integration.

According to some example embodiments of inventive concepts, a semiconductor device includes a semiconductor substrate, a plurality of cell gate electrodes on the semiconductor substrate, vertical structures on the semiconductor substrate, and upper peripheral transistors on the semiconductor substrate. The plurality of cell gate electrodes may be stacked on top of each other and extend in a direction parallel to a surface of the semiconductor substrate. The plurality of cell gate electrodes may include pad regions arranged in a stepped manner at end portions of the plurality of cell gate electrodes. The vertical structures may pass through the plurality of cell gate electrodes. The vertical structures may respectively include a channel layer. The upper peripheral transistors may include an upper peripheral gate electrode at a level higher than a level of the plurality of cell gate electrodes, body patterns passing through the upper peripheral gate electrode and being electrically connected to the pad regions, and gate dielectric layers between the upper peripheral gate electrode and the body patterns.

According to some example embodiments of inventive concepts, a semiconductor device includes a semiconductor substrate, a memory cell array on the semiconductor substrate, and a peripheral circuit on the semiconductor substrate. The memory cell array may include first word lines and vertical structures. The first word lines may be stacked on top of each other in a direction perpendicular to a surface of the semiconductor substrate. The vertical structures may pass through the first word lines. The vertical structures may respectively include a channel layer and a drain connected to an upper region of the channel layer. The first word lines may include stepped-first pad regions at end portions of the first word lines. The stepped-first pad regions may extend in a direction parallel to the surface of the semiconductor substrate. The peripheral circuit may include an upper circuit electrically connected to the pad regions. The upper circuit may include an upper peripheral gate electrode at a level higher than a level of the first word lines. The upper circuit may include body patterns passing through the upper peripheral gate electrode and electrically connected to the stepped-first pad regions. The upper circuit may include an upper gate dielectric layer between the upper peripheral gate electrode and the body patterns.

According to some example embodiments of inventive concepts, a semiconductor device includes a substrate, a plurality of word lines stacked on top of each other on the substrate and spaced apart from each other in a vertical direction compared to a top surface of the substrate, a plurality of vertical structures extending through a portion of the plurality of word lines in the vertical direction, lower contact plugs, upper peripheral transistors on the lower contact pugs, and an upper peripheral wiring on the upper peripheral transistors. A width of the plurality of word lines may decrease as a distance of the plurality of word lines from the top surface of the substrate increases. The plurality of word lines may include stepped-pad regions at end portions of the plurality of word lines. The lower contact plugs may be on the stepped-pad regions of the plurality of word lines. The lower contact plugs may extend in the vertical direction.

BRIEF DESCRIPTION OF DRAWINGS

The above and other aspects, features, and effects of inventive concepts will be more clearly understood from the following detailed description, taken in conjunction with the accompanying drawings, in which.

DETAILED DESCRIPTION

Figure 1:
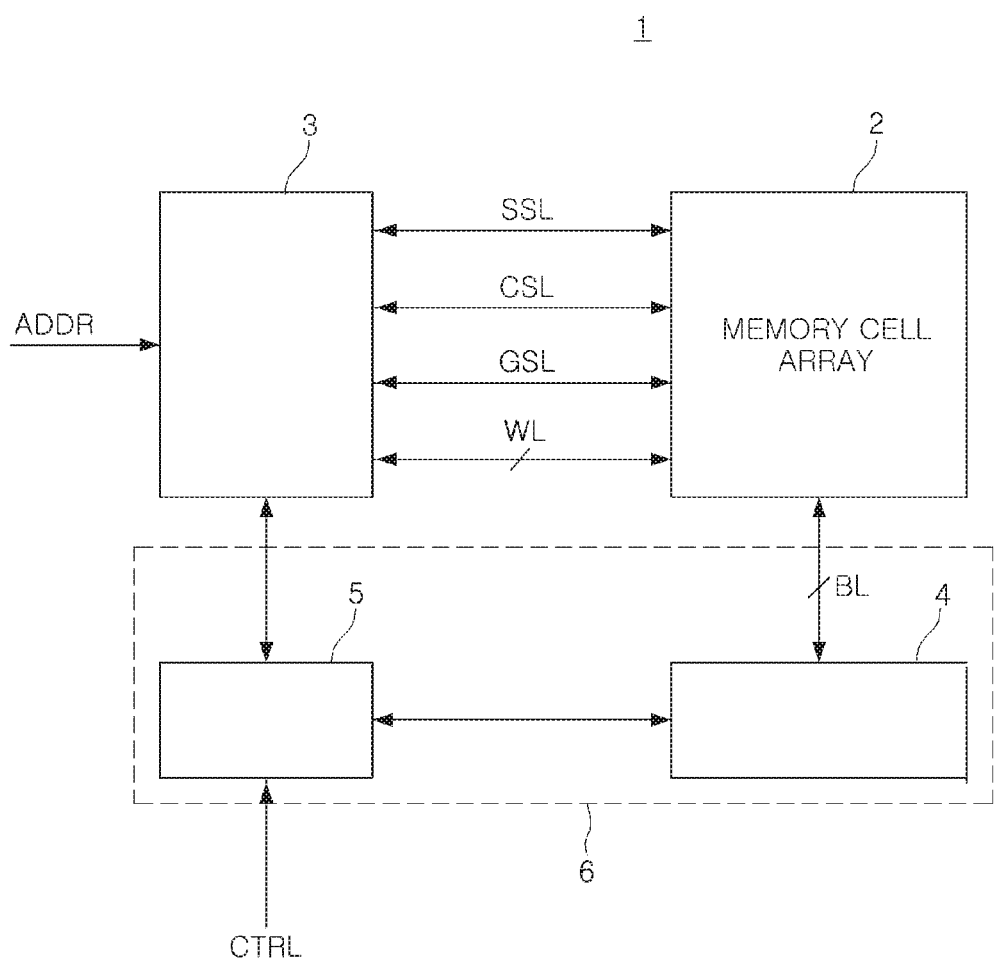
FIG. 1 is a schematic block diagram of a semiconductor device according to some example embodiments.

FIG. 1 is a schematic block diagram of a semiconductor device according to some example embodiments.

With reference to FIG. 1, a semiconductor device 1 according to some example embodiments may include a memory cell array 2, a row decoder circuit region 3, and a core logic circuit region 6. The core logic circuit region 6 may include a read/write circuit 4 and a control circuit 5.

The memory cell array 2 may include a plurality of memory cells arranged in a plurality of rows and columns. The plurality of memory cells included in the memory cell array 2 may be divided into a plurality of memory blocks. Each memory block of the plurality of memory blocks may include a plurality of word lines WL, a plurality of string select lines SSL, a plurality of ground select lines GSL, a plurality of bit lines BL, and at least a single common source line CSL.

The plurality of memory cells MC included in the memory cell array 2 may be connected to the row decoder circuit region 3 through the word lines WL, the common source line CSL, the string select line SSL, the ground select line GSL, and the like, and may be connected to the read/write circuit 4 through the bit lines BL.

In some example embodiments, the plurality of memory cells arranged in the same row may be connected to the same word line WL, and the plurality of memory cells arranged in the same column may be connected to the same bit line BL.

The row decoder circuit region 3 may receive address data ADDR from an external source, and the address data ADDR, which is received, may be decoded to determine a voltage supplied to at least a portion of the word lines WL, the common source line CSL, the string select lines SSL, and the ground select lines GSL, connected to the memory cell array 2.

The read/write circuit 4 may select at least a portion of the bit lines BL connected to the memory cell array 2 according to a command received from the control circuit 5. The read/write circuit 4 may read data stored in a memory cell connected to at least some selected bit lines BL, and/or may write data to the memory cell connected to at least some selected bit lines BL. The read/write circuit 4 may include a circuit such as a page buffer, an input/output buffer, a data latch, and the like, in order to perform an operation described above.

The control circuit 5 may respond to a control signal CTRL transmitted from an external source to control operations of the row decoder circuit region 3 and the read/write circuit 4. When data stored in the memory cell array 2 is read, the control circuit 5 may control an operation of the row decoder circuit region 3 to supply a voltage for a reading operation to a word line WL in which data to be read is stored. When the voltage for the reading operation is supplied to a specific word line WL, the control circuit 5 may control the read/write circuit 4 to read data stored in a memory cell connected to a word line WL to which the voltage for the reading operation is supplied.

Meanwhile, when data is written to the memory cell array 2, the control circuit 5 may control an operation of the row decoder circuit region 3 to supply a voltage for a write operation to a word line WL to which a user desires to write data. When the voltage for the write operation is supplied to a specific word line WL, the control circuit 5 may control the read/write circuit 4 to write data to a memory cell connected to the word line WL to which the voltage for the write operation is supplied.

The memory cell array 2 may include a plurality of memory cells that are three-dimensionally arranged on a substrate, and word lines and bit lines electrically connected to the memory cells. For example, the cell array may include a plurality of NAND cell strings, which may include (or consist of) a ground select transistor coupled to a common source line, a string select transistor coupled to the bit line, and a plurality of memory cells disposed between the ground and string select transistors. For example, in some example embodiments, the NAND strings may be vertically oriented such that at least one memory cell is located over another memory cell. The at least one memory cell may include a charge trap layer. The following patent documents, which are hereby incorporated by reference in their entirety, describe suitable configurations for three-dimensional memory arrays, in which the three-dimensional memory array is configured as a plurality of levels, with word lines and/orbit lines shared between levels: U.S. Pat. Nos. 7,679,133; 8,553,466; 8,654,587; 8,559,235; and US Pat. Pub. No. 2011/0233648.

Figure 2:
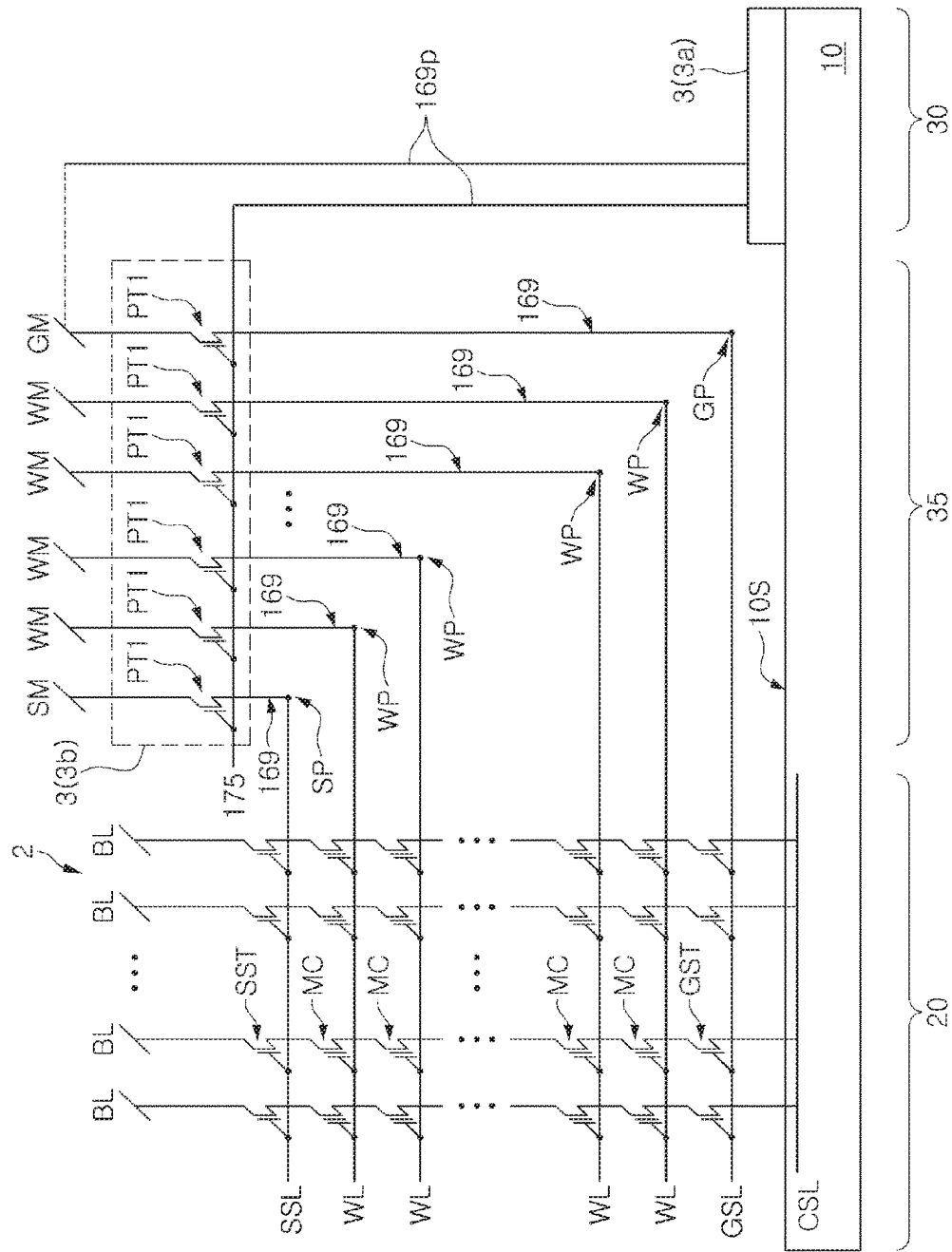
FIG. 2 is a view illustrating a semiconductor device according to some example embodiments.
Figure 3A:
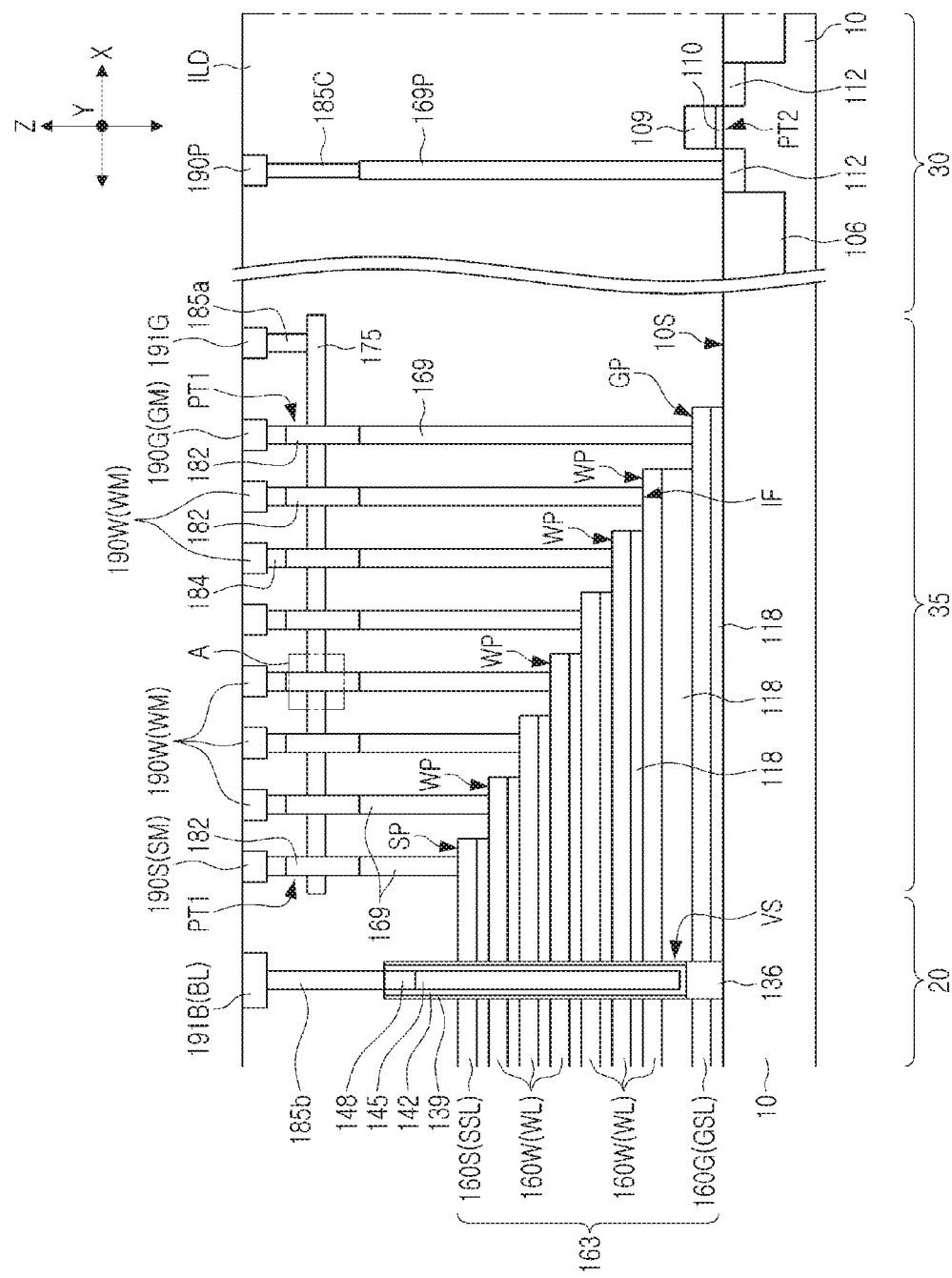
FIGS. 3A and 3B are cross-sectional views illustrating a semiconductor device according to some example embodiments.
Figure 3B:
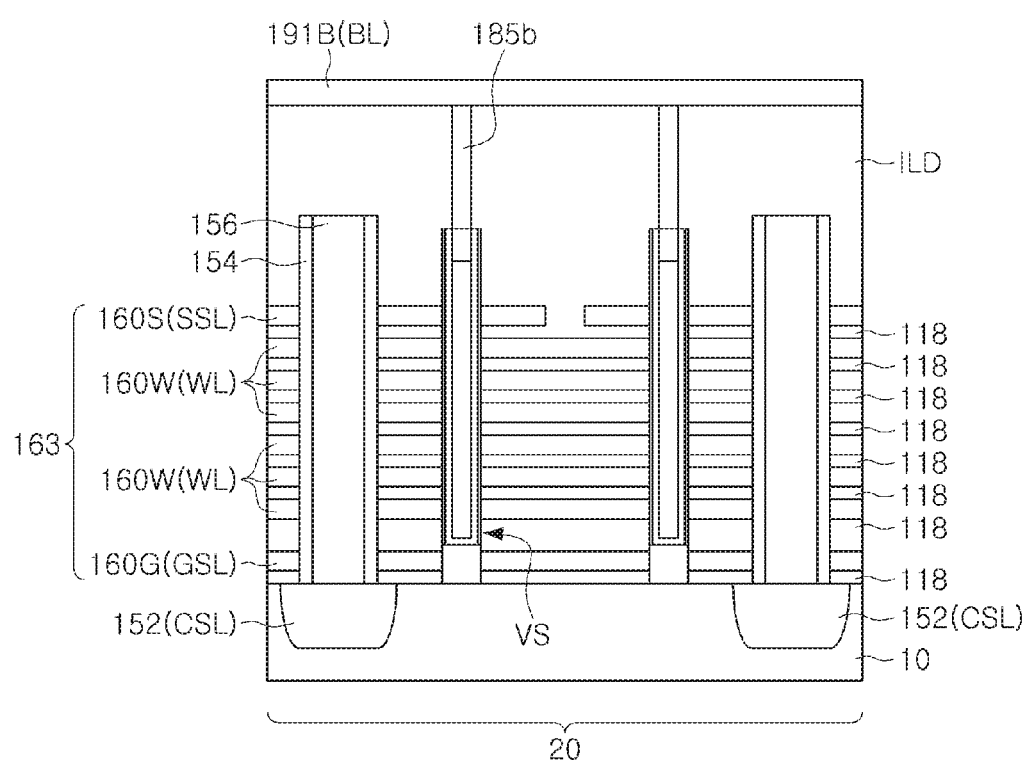

Next, an example of the memory cell array 2 and the row decoder circuit region 3, illustrated in FIG. 1, will be described with reference to FIGS. FIGS. 2, 3A, and 3B, along with FIG. 1. FIG. 2 is a view conceptually illustrating an equivalent circuit of the memory cell array 2 disposed on a semiconductor substrate and the row decoder circuit region 3 disposed on the semiconductor substrate, in order to illustrate the arrangement relationship of the memory cell array 2 and the row decoder circuit region 3, disposed on a semiconductor substrate 10. FIG. 3A is a cross-sectional view illustrating a region taken in a longitudinal direction X of a word line WL in order to illustrate a portion of the memory cell array 2 and a portion of the row decoder circuit region 3. In addition, FIG. 3B is a cross-sectional view illustrating a region taken in a longitudinal direction Y of a bit line in order to illustrate the memory cell array 2.

First, with reference to FIGS. 1 and 2, an example of the memory cell array 2 and the row decoder circuit region 3 will be described.

Along with FIG. 1, with respect to FIG. 2, the semiconductor substrate 10 may have a first region 20, a second region 30, and a middle region 35 disposed between the first region 20 and the second region 30. The middle region 35 may be referred to as a buffer region or a third region. The memory cell array 2, described with reference to FIG. 1, may be disposed in the first region 20 of the semiconductor substrate 10. The memory cell array 2 disposed in the first region 20 of the semiconductor substrate 10 will be described.

The memory cell array 2 disposed in the first region 20 of the semiconductor substrate 10 may include memory cell strings including a plurality of memory cells MC connected to each other in series and arranged in a direction perpendicular to a surface 10S of the semiconductor substrate 10, in addition to a ground select transistor GST and a string select transistor SST connected to both ends of each of the memory cells MC in series. The plurality of memory cells MC, connected to each other in series, may be connected to a plurality of word lines WL for selecting the plurality of memory cells MC, respectively.

Meanwhile, a dummy cell may be further disposed between a lowest memory cell of the plurality of memory cells MC and the ground select transistor GST and between an uppermost memory cell of the plurality of memory cells MC and the string select transistor SST.

A gate terminal of the ground select transistor GST may be connected to the ground select line GSL, and a source terminal thereof may be connected to the common source line CSL.

Meanwhile, a gate terminal of the string select transistor SST may be connected to the string select line SSL, and a source terminal thereof may be connected to a drain terminal of the memory cells MC.

In FIG. 2, a structure in which a ground select transistor GST and a string select transistor SST are connected to the plurality of memory cells MC connected to each other in series is illustrated, but a plurality of ground select transistors GST or a plurality of string select transistors SST may be connected thereto.

A drain terminal of the string select transistor SST may be connected to a bit line BL. When a signal is applied to a gate terminal of the string select transistor SST through the string select line SSL, the signal applied through the bit line BL is transmitted to the plurality of memory cells MC connected to each other in series, and thus, data reading and data writing operations may be performed. In addition, a desired (and/or alternative predetermined) erase voltage is applied through the semiconductor substrate 10, and thus, an erasing operation for erasing data written to the plurality of memory cells MC may be performed.

The string select line SSL, the plurality of word lines WL, and the ground select line GSL are extended from the first region 20 to the middle region 35, and end portions thereof may be located in the middle region 35.

The end portions of the string select line SSL, the plurality of word lines WL, and the ground select line GSL may be pad regions SP, WP, and GP for forming electrical connections to a peripheral circuit. The pad regions SP, WP, and GP of the string select lines SSL, the plurality of word lines WL, and the ground select lines GSL may be arranged in a stepped manner.

The row decoder circuit region 3 may include an upper circuit 3b formed in the middle region 35 of the semiconductor substrate 10 and a lower circuit 3a formed in the second region 30 of the semiconductor substrate 10.

The upper circuit 3b may include upper peripheral transistors PT1 which may be electrically connected to the pad regions SP, WP, and GP. The upper peripheral transistors PT1 may be pass transistors of the row decoder circuit region 3.

As the upper peripheral transistors PT1, which may be the pass transistors of the row decoder circuit region 3, are disposed in the pad regions SP, WP, and GP, a flat area, in which the upper peripheral transistors PT1 are located in the semiconductor substrate 10, may be reduced. Thus, integration of the semiconductor device 1 may be improved.

The upper peripheral transistors PT1 may include an upper peripheral gate electrode 175. Lower contact plugs 169 may be disposed between the upper peripheral transistors PT1 and the pad regions SP, WP, and GP. Wirings SM, WM, and GM, in addition to lower peripheral contact plugs 169P, for electrically connecting the upper circuit 3b to the lower circuit 3a, may be provided. The wirings SM, WM, and GM may include a string line wiring 190S (SM) which may be electrically connected to the string select line SSL, word line wirings 190W (WM) which may be electrically connected to the word lines WL, and a ground line wiring 190G (GM) which may be electrically connected to the ground select line GSL.

Next, along with FIGS. 1 and 2, with reference to FIGS. 3A and 3B, an example of the memory cell array 2 and the row decoder circuit region 3 will be described.

Along with FIGS. 1 and 2, with reference to FIGS. 3A and 3B, a gate-stack structure 163 may be disposed in the first region 20 of the semiconductor substrate 10. The gate-stack structure 163 may include a lower gate electrode 160G, cell gate electrodes 160W on the lower gate electrode 160G, and an upper gate electrode 160S on the cell gate electrodes 160W.

The upper gate electrode 160S may be the string select line SSL of the memory cell array 2, the lower gate electrode 160G may be the ground select line GSL of the memory cell array 2, and the cell gate electrodes 160W may be the word lines WL of the memory cell array 2. Interlayer insulating layers 118 may be disposed below each of the gate electrodes 160G, 160W, and 160S.

Pad regions SP, WP, and GP formed to be extended from the gate electrodes 160G, 160W, and 160S in a direction parallel to the surface 10S of the semiconductor substrate 10 may be provided. Thus, since the pad regions SP, WP, and GP are formed to be continuously led from the gate electrodes 160G, 160W, and 160S in a horizontal direction, the pad regions may be disposed on the same plane as the gate electrodes 160G, 160W, and 160S.

Isolation patterns 156 passing through the gate-stack structure 163 may be disposed in the first region 20 of the semiconductor substrate 10. Impurity regions 152 may be disposed inside the semiconductor substrate 10 adjacent to the isolation patterns 156. The impurity regions 152 may be the common source line CSL of the memory cell array 2. The impurity regions 152 may have N-type conductivity. Insulating spacers 154 may be disposed on side surfaces of the isolation patterns 156. The isolation patterns 156 may be formed of a conductive material.

Vertical structures VS passing through the gate-stack structure 163 may be disposed in the first region 20 of the semiconductor substrate 10. The vertical structures VS may be disposed between the isolation patterns 156. Each of the vertical structures VS may include a semiconductor pattern 136, a core pattern 145, a drain 148, a channel layer 142, and a dielectric structure 139. The channel layer 142 may have a cylinder shape, of which the inside is empty, passing through the gate electrodes 160W and 160S correspond to the plurality of word lines WL and the string select line SSL, the core pattern 145 may be embedded inside the channel layer 142, and the drain 148 may be connected to an upper region of the channel layer 142 to be disposed on the core pattern 145. The drain 148 may be formed of polysilicon having N-type conductivity. The semiconductor pattern 136 may be disposed in a lower portion of the channel layer 142 and may have a side surface opposing the gate electrode 160G corresponding to the ground select line GSL. A gate insulating layer may be interposed between the semiconductor pattern 136 and the gate electrode 160G. The dielectric structure 139 may be disposed to surround a side surface of the channel layer 142. The dielectric structure 139 may include a layer for storing data regarding the memory cells MC of the memory cell array 2.

Figure 4A:
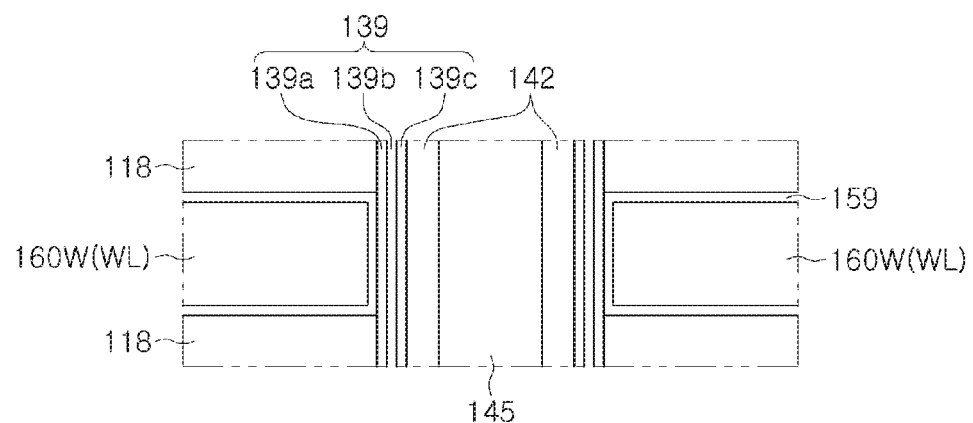
FIG. 4A is a partially enlarged view illustrating an example of a semiconductor device according to some example embodiments.
Figure 4B:
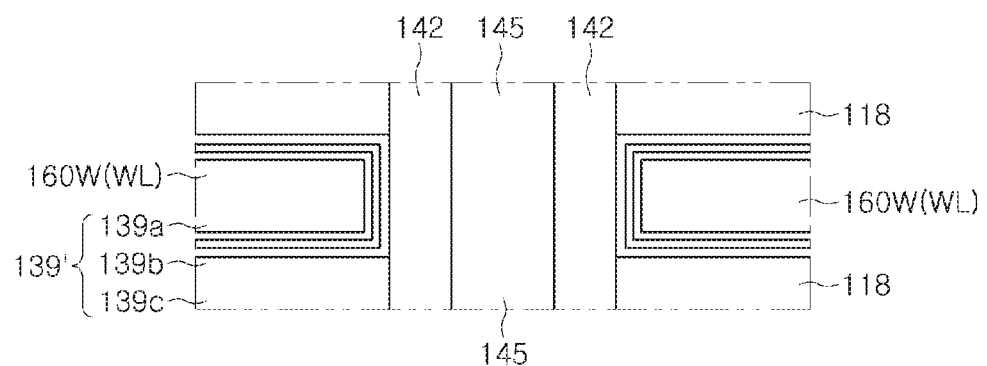
FIG. 4B is a partially enlarged view illustrating a modified example of a semiconductor device according to some example embodiments.

Examples of the dielectric structure 139 will be described with reference to FIGS. 4A and 4B. FIGS. 4A and 4B are partially enlarged views in which a portion of FIG. 3A or FIG. 3B is enlarged to illustrate examples of the dielectric structure 139.

First, with reference to FIG. 4A, the dielectric structure 139 may include a first dielectric layer 139a, a second dielectric layer 139b, and a third dielectric layer 139c. The second dielectric layer 139b may be disposed between the first dielectric layer 139a and the third dielectric layer 139c. The third dielectric layer 139c may be interposed between the second dielectric layer 139b and the channel layer 142. The second dielectric layer 139b of the dielectric structure 139 may be a data storage layer for storing data of the memory cells MC of the memory cell array 2. For example, the second dielectric layer 139b may be a charge trapping layer. In an example, an additional dielectric layer 159, disposed between the plurality of cell gate electrodes 160W and the dielectric structure 139 and extended between the plurality of cell gate electrodes 160W and the interlayer insulating layers 118, may be provided.

The dielectric structure 139 may be interposed between the plurality of cell gate electrodes 160W and the channel layer 142 to be extended between the interlayer insulating layers 118 and the channel layer 142. However, inventive concepts are not limited thereto. For example, a modified dielectric structure 139' may be interposed between the plurality of cell gate electrodes 160W and the channel layer 142 to be extended between the interlayer insulating layers 118 and the plurality of cell gate electrodes 160W.

Again, along with FIGS. 1 and 2, with reference to FIGS. 3A and 3B, the upper peripheral transistors PT1 may be disposed on the middle region 35 of the semiconductor substrate 10. A lower peripheral transistor PT2 may be disposed in the second region 30 of the semiconductor substrate 10. The upper peripheral transistors PT1 may be a transistor forming the row decoder circuit region (3 of FIGS. 1 and 2) and the first peripheral circuit (3a of FIG. 2). The upper peripheral transistors PT1 may be pass transistors in the row decoder circuit region (3 of FIGS. 1 and 2). The lower peripheral transistor PT2 may be a transistor forming the row decoder circuit region (3 of FIGS. 1 and 2) and the second peripheral circuit (3b of FIG. 2). The second peripheral circuit (3b of FIG. 2) may be electrically connected to the upper peripheral transistors PT1 serving as pass transistors to form a row decoder circuit of the memory cell array 2.

The lower peripheral transistor PT2 may include a lower peripheral gate 109 and a gate insulating layer 110 disposed on the semiconductor substrate 10 defined by a device isolation region 106 formed in the semiconductor substrate 10 and a source/drain 112 disposed inside the semiconductor substrate 10 on both sides of the lower peripheral gate 109. The lower peripheral transistor PT2 may be disposed on a level lower than that of the upper peripheral transistors PT1. The lower peripheral transistor PT2 may be a planar transistor disposed on a surface of the semiconductor substrate 10, and the upper peripheral transistors PT1 may be vertical transistors. The gate insulating layer 110 may include silicon oxide, but is not limited thereto.

The upper peripheral transistors PT1 may include the upper peripheral gate electrode 175 and a body pattern 182 passing through the upper peripheral gate electrode 175. A distance between the upper peripheral gate electrode 175 and the surface 10S of the semiconductor substrate 10 may be greater than a distance between upper surfaces of the vertical structures VS and the surface 10S of the semiconductor substrate 10.

First peripheral wirings 190S, 190W, and 190G may be disposed on the upper peripheral transistors PT1. The first peripheral wirings 190S, 190W, and 190G may include a string line wiring 190S (SM) electrically connected to the string select line SSL, word line wirings 190W (WM) electrically connected to the word lines WL, and a ground line wiring 190G (GM) electrically connected to the ground select lines GSL. An upper peripheral gate wiring 191G which may be electrically connected to the upper peripheral gate electrode 175 may be provided.

Upper contact plugs 184 may be disposed between the upper peripheral transistors PT1 and the first peripheral wirings 190S, 190W, and 190G. An upper gate contact plug 185a may be disposed between the upper peripheral gate electrode 175 and the upper peripheral gate wiring 191G.

A second peripheral wiring 190P may be disposed on the lower peripheral transistor PT2, and cell conductive lines 191B may be disposed on the vertical structures VS. The cell conductive lines 191B may be bit lines BL. A bit line contact structure 185b may be disposed between the cell conductive lines 191B and the vertical structures VS. A lower peripheral contact plug 169P and an upper peripheral contact plug 185C on the lower peripheral contact plug 169P may be disposed between the lower peripheral transistor PT2 and the second peripheral wiring 190P.

The lower contact plugs 169 disposed between body patterns 182 of the upper peripheral transistors PT1 and the pad regions SP, WP, and GP of the gate-stack structure 163 may be provided. The lower contact plugs 169 may be electrically connected to the pad regions SP, WP, and GP, in addition to the body patterns 182. The lower contact plugs 169, in addition to the pad regions SP, WP, and GP may be formed in different processes. Thus, interfaces IF may be formed between the lower contact plugs 169 and the pad regions SP, WP, and GP. The lower contact plugs 169 may have upper surfaces coplanar with each other. The upper surfaces of the lower contact plugs 169 may be disposed on a level higher than that of the upper surfaces of the vertical structures VS.

Figure 5A:
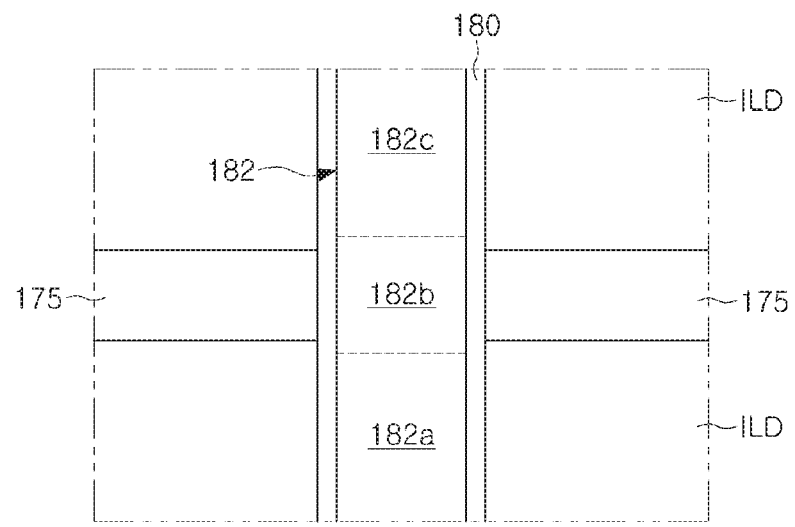
FIG. 5A is a partially enlarged view illustrating an example of a semiconductor device according to some example embodiments.

The upper peripheral transistors PT1 may include the upper peripheral gate electrode 175 and the body patterns 182 passing through the upper peripheral gate electrode 175 to be electrically connected to the lower contact plugs 169. In addition, the upper peripheral transistors PT1 may include an upper peripheral gate dielectric layer disposed between the upper peripheral gate electrode 175 and the body patterns 182. One upper peripheral transistor PT1 of the upper peripheral transistors PT1 will be described with reference to FIG. 5A. FIG. 5A is a partially enlarged view in which portion A of FIG. 3A is enlarged.

With reference to FIG. 5A, the upper peripheral transistor PT1 may include the upper peripheral gate electrode 175, the body pattern 182, and an upper peripheral gate dielectric layer 180. The body pattern 182 may pass through the upper peripheral gate electrode 175. The body pattern 182 may be formed of a semiconductor material such as polysilicon, or the like. The body pattern 182 may include a lower impurity region 182a, an upper impurity region 182c, and a channel region 182b disposed between the upper impurity region 182a and lower impurity region 182c. The channel region 182b may be surrounded by the upper peripheral gate electrode 175.

The upper impurity region 182a and lower impurity region 182c may be source/drains of the upper peripheral transistor PT1. In one example, the upper impurity region 182a and lower impurity region 182c may have N-type conductivity, and the channel region 182b may have P-type conductivity. Thus, the upper peripheral transistor PT1 may be an NMOS transistor.

Figure 5B:
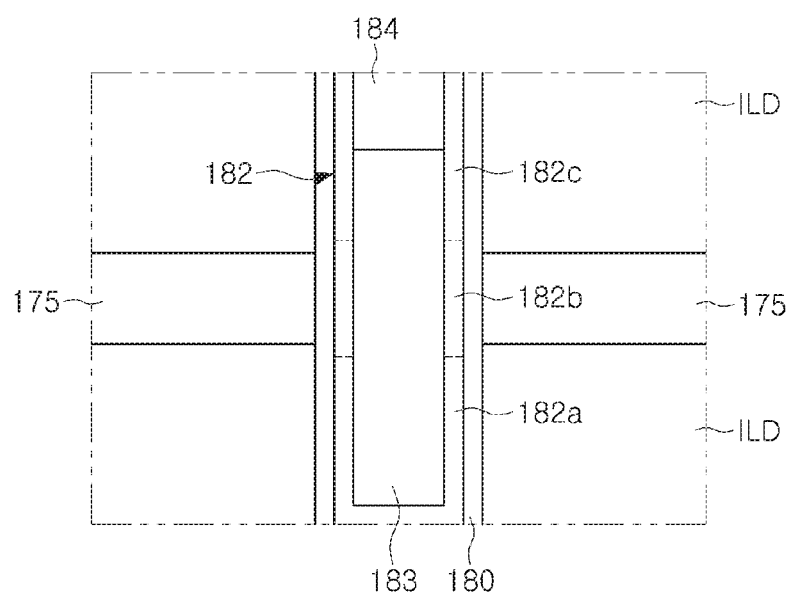
FIG. 5B is a partially enlarged view illustrating a modified example of a semiconductor device according to some example embodiments.

The body pattern 182 may have a pillar shape. However, inventive concepts are not limited thereto. As described above, a deformed shape of the body pattern 182 will be described with reference to FIG. 5B. With reference to FIG. 5B, the body pattern 182 may have a cylinder shape of which the inside is empty. For example, a bottom region of the body pattern 182 in contact with the lower contact plugs 169 may have a plate shape, in order to increase a contact area with the lower contact plugs 169 to reduce resistance, and a region of the body pattern 182 opposing the upper peripheral gate electrode 175 may have a cylindrical shape of which the inside is empty, in order to improve turn-off characteristics of a transistor. An insulating pattern 183 with which the inside of the body pattern 182, of which the inside is empty as described above, is filled may be provided. A pad portion 184 connected to an upper region of the body pattern 182 may be disposed on the insulating pattern 183. The pad portion 184 may be formed of polysilicon having N-type conductivity. The body pattern 182 may include the upper impurity region 182a and the lower impurity region 182c, having N-type conductivity, in addition to the channel region 182b disposed between the upper impurity region 182a and lower impurity region 182c and having P-type conductivity.

Figure 6:
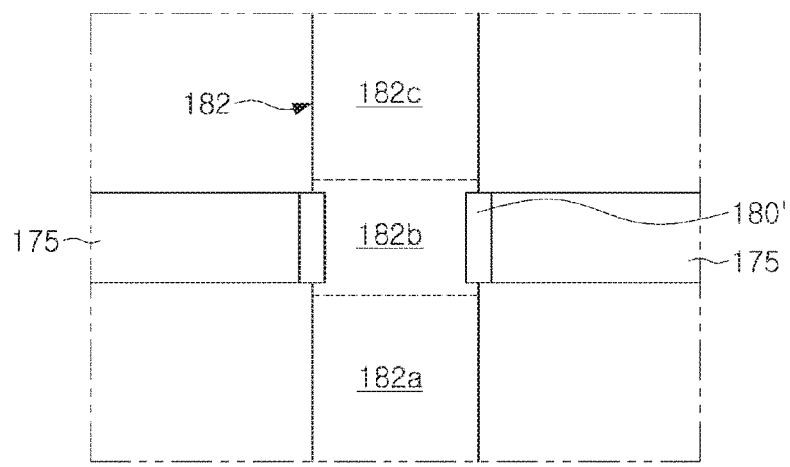
FIG. 6 is a partially enlarged view illustrating a modified example of a semiconductor device according to some example embodiments.

The upper peripheral gate dielectric layer 180 may be interposed between the upper peripheral gate electrode 175 and the body pattern 182 and may be disposed to surround a side surface of the body pattern 182. The upper peripheral gate dielectric layer 180 may be formed of silicon oxide, nitrogen-doped silicon oxide, and/or high-k dielectric. The upper peripheral gate dielectric layer 180 may be formed in a deposition process such as an atomic layer deposition process, or the like. Thus, the upper peripheral gate dielectric layer 180 may cover the entirety of a side surface of the body pattern 182, as illustrated in FIGS. 5A and 5B. However, inventive concepts are not limited thereto. For example, as illustrated in FIG. 6, an upper peripheral gate dielectric layer (180' of FIG. 6) formed of silicon oxide may be disposed between the upper peripheral gate electrode 175 and the body pattern 182, in a thermal oxidation process. When the upper peripheral gate dielectric layer (180' of FIG. 6) is formed of silicon oxide in a thermal oxidation process as described above, the upper peripheral gate electrode 175 may be formed of polysilicon.

In some example embodiments, the gate-stack structure 163 may be provided as a plurality of gate-stack structures disposed on the semiconductor substrate 10 in a direction parallel to the surface 10S of the semiconductor substrate 10. In addition, the upper peripheral gate electrode 175 may be variously deformed to allow the upper peripheral transistors PT1 to be connected to the memory cell array 2 in various methods. Various examples of a semiconductor device including the gate-stack structure 163 provided as a plurality of gate-stack structures and the upper peripheral gate electrode 175, which may be variously deformed as described above, will be described with reference to FIGS. 7A, 7B, 8A, 8B, 9A, 9B, and 9C. FIGS. 7A, 7B, 8A, 8B, 9A, 9B, and 9C are perspective views illustrating various modifications examples of the semiconductor device. Hereinafter, when the semiconductor device is described with reference to FIGS. 7A, 7B, 8A, 8B, 9A, 9B, and 9C, components, having been illustrated in FIGS. 1 through 6, may be understood to be the same as those illustrated in FIGS. 1 to 6, unless otherwise described.

Figure 7A:
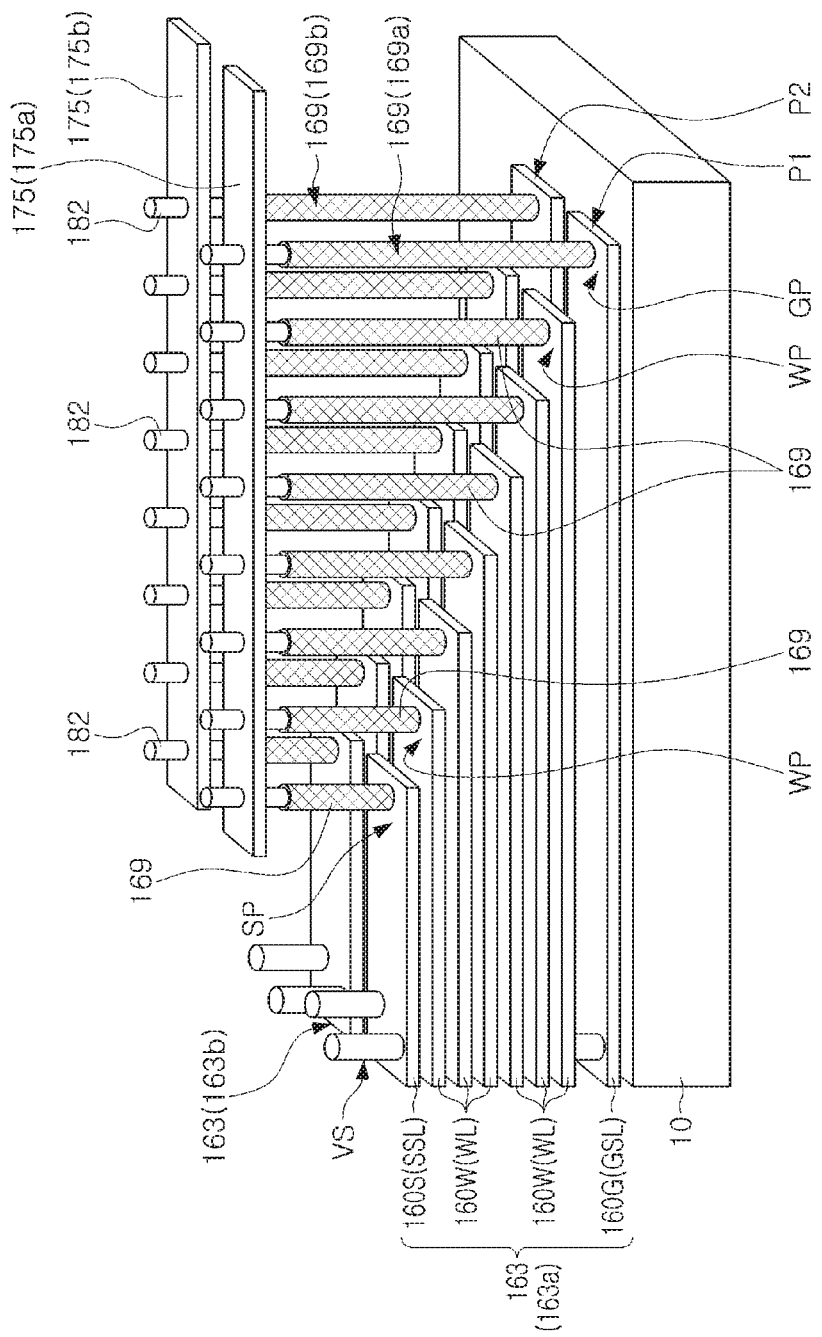
FIGS. 7A, 7B, 8A, 8B, 9A, 9B, and 9C are perspective views illustrating various examples of a semiconductor device according to some example embodiments.

First, with reference to FIG. 7A, the gate-stack structure 163 may include a first gate-stack structure 163a and a second gate-stack structure 163b disposed in a direction parallel to a surface of the semiconductor substrate 10 above the semiconductor substrate 10.

The gate-stack structure 163 may include stepped-pad regions SP, WP, and GP. Thus, the first gate-stack structure 163a may have first pad regions P1, and the second gate-stack structure 163b may have second pad regions P2.

The lower contact plugs 169 may include first lower contact plugs 169a disposed on the first pad regions P1 of the first gate-stack structure 163a, and second lower contact plugs 169b disposed on the second pad regions P2 of the second gate-stack structure 163b.

The upper peripheral gate electrode 175 may include a first upper peripheral gate electrode 175a overlapping the first lower contact plugs 169a and a second upper peripheral gate electrode 175b overlapping the second lower contact plugs 169b.

Figure 7B:
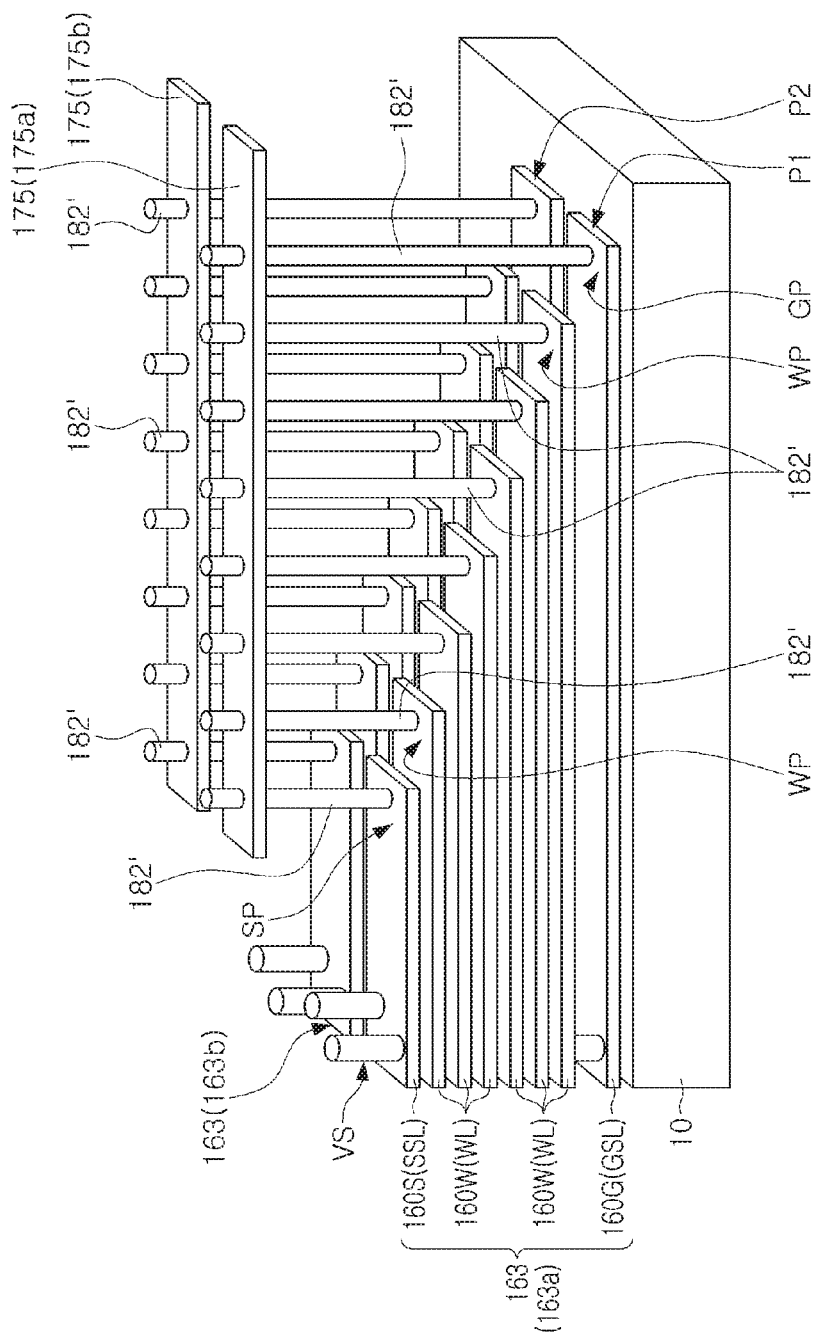

The body patterns 182 may pass through the first upper peripheral gate electrode 175a and the second upper peripheral gate electrode 175b to be electrically connected to the first pad regions P1 and the second pad regions P2 of the first and second gate-stack structures 163 through the first lower contact plugs 169a and the second lower contact plugs 169b. However, inventive concepts are not limited thereto. For example, as illustrated in FIG. 7B, body patterns (182' of FIG. 7B) passing through the upper peripheral gate electrode 175 may be extended toward a lower portion thereof to be directly in contact with the pad regions SP, WP, and GP while being electrically connected to the pad regions SP, WP, and GP.

Figure 8A:
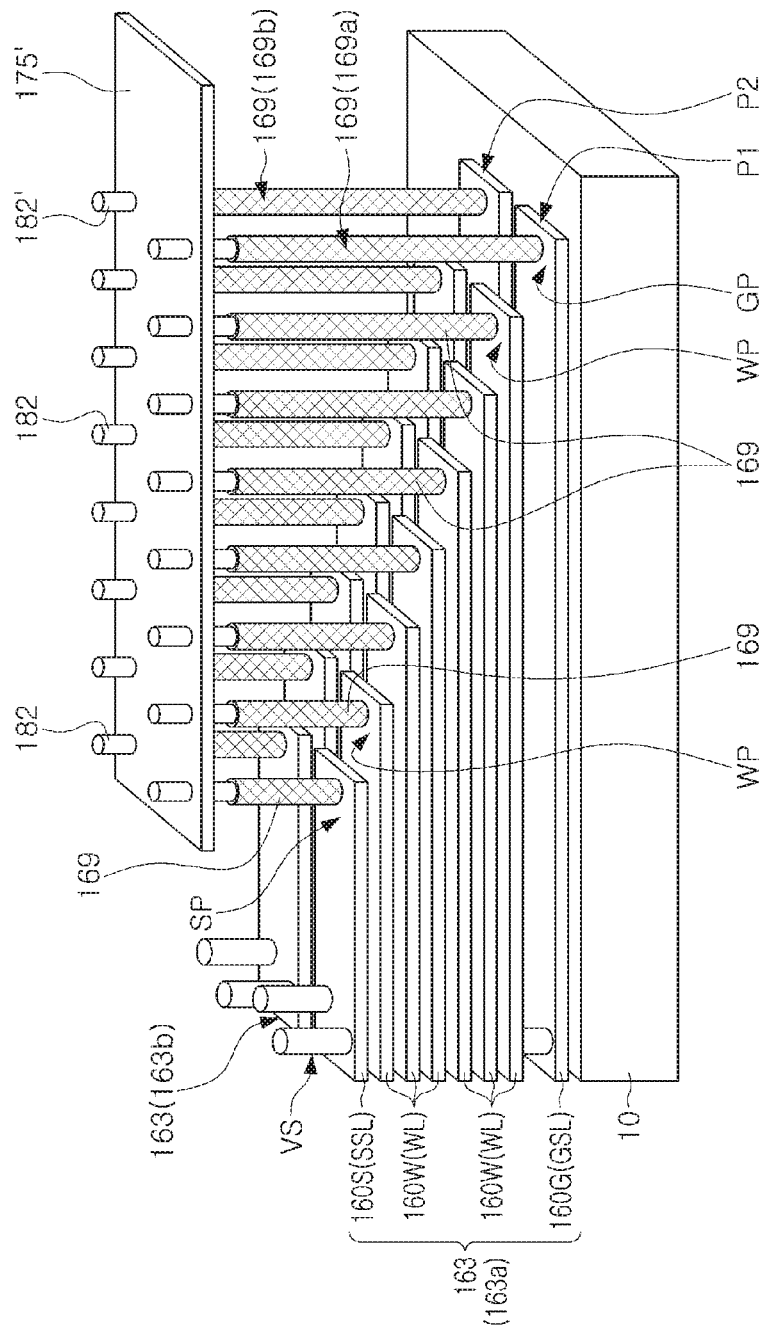

Again, with reference to FIG. 7A, the upper peripheral gate electrode 175 may be divided into the first upper peripheral gate electrode 175a and the second upper peripheral gate electrode 175b, but inventive concepts are not limited thereto. For example, as illustrated in FIG. 8A, one upper peripheral gate electrode (175' of FIG. 8A) may overlap the first pad regions P1 and the second pad regions P2 of the first gate-stack structure 163a and the second gate-stack structure 163b.

Figure 8B:
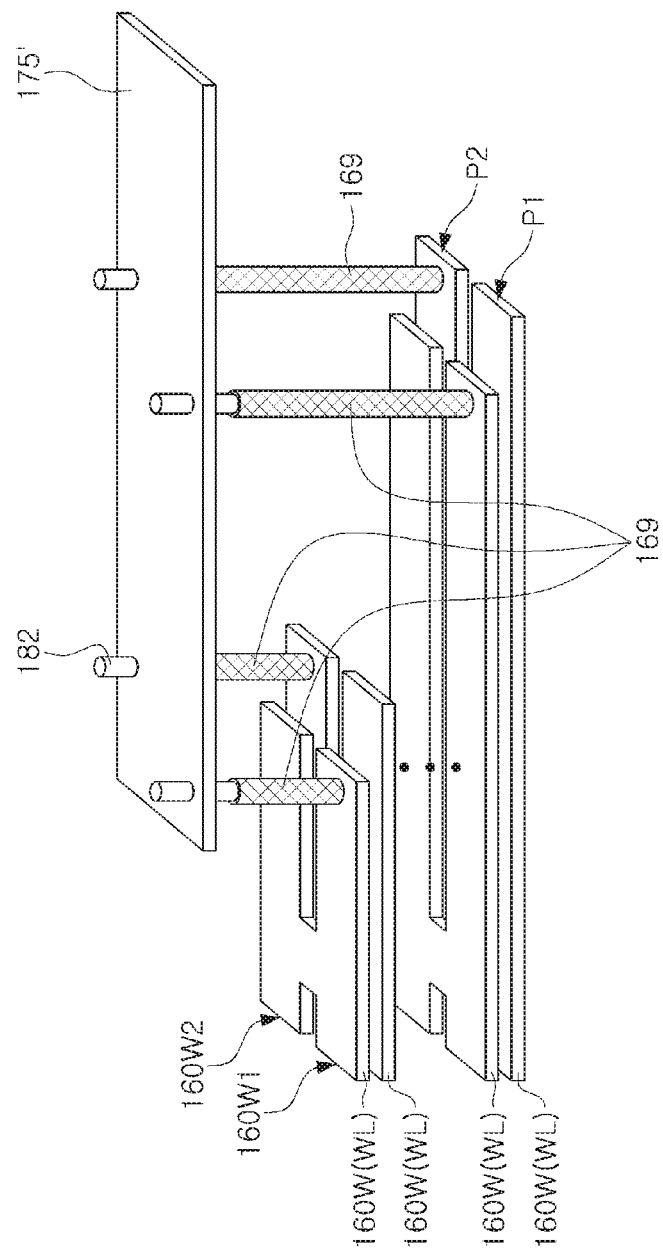

In the first gate-stack structure 163a and the second gate-stack structure 163b, gate electrodes disposed on the same plane and adjacent to each other may be spaced apart from each other. However, inventive concepts are not limited thereto. For example, portions of the first gate-stack structure (163a of FIG. 8A) and the second gate-stack structure (163b of FIG. 8A) may be connected to each other. For example, as illustrated in FIG. 8B, portions of a first cell gate electrode (160W1 of FIG. 8B) and a second cell gate electrode (160W2 of FIG. 8B) of the first gate-stack structure (163a of FIG. 8A) and the second gate-stack structure (163b of FIG. 8A) disposed on the same plane and adjacent to each other may be connected to each other. Thus, the first cell gate electrode (160W1 of FIG. 8B) and the second cell gate electrode (160W2 of FIG. 8B), disposed on the same plane and connected to each other, may be electrically connected to one lower contact plug 169.

As described above, one lower contact plug 169 may be electrically connected to one body pattern 182. However, inventive concepts are not limited thereto. For example, plugs adjacent to each other and having the same height, of the first lower contact plugs 169a and the second lower contact plugs 169b, may be electrically connected to one body pattern 182. Examples as described above will be described with reference to FIGS. 9A and 9B.

Figure 9A:
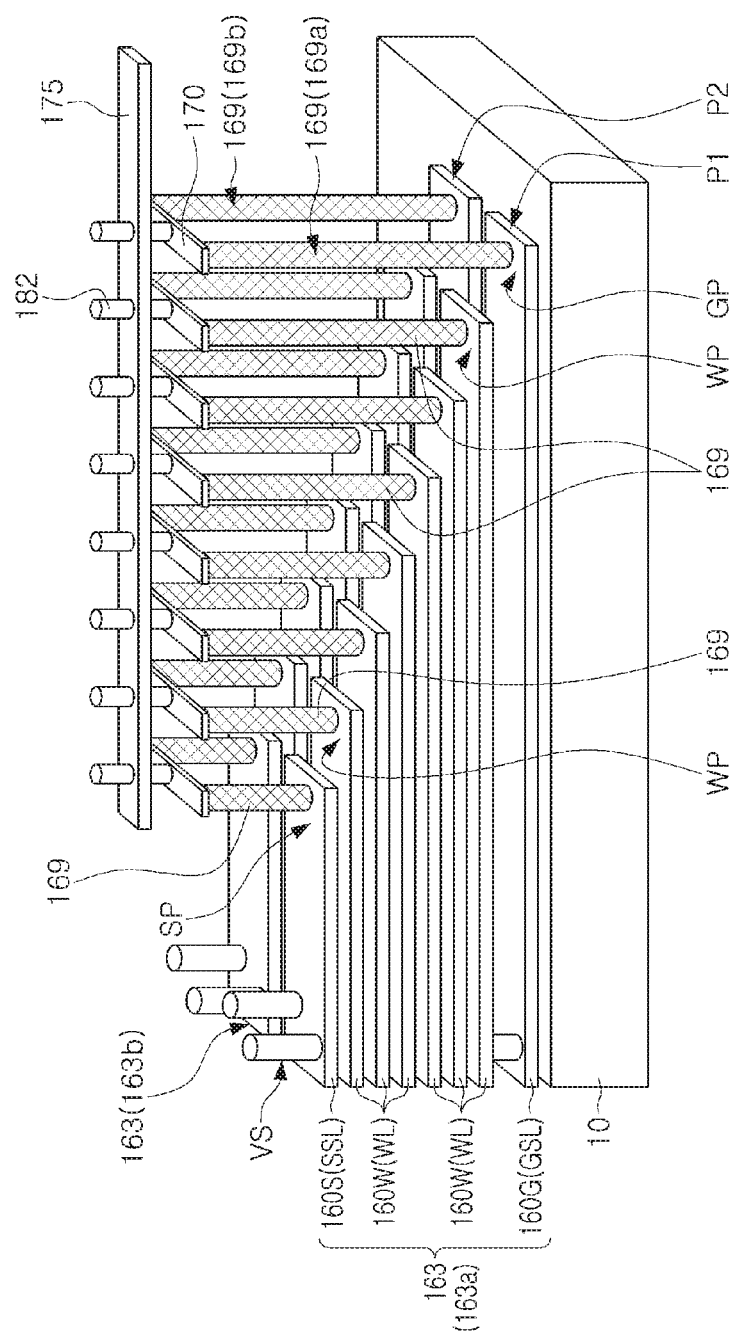

With reference to FIG. 9A, connection patterns 170 may be disposed on the first lower contact plugs 169a and the second lower contact plugs 169b. The connection patterns 170 may allow lower contact plugs of the lower contact plugs 169, adjacent to each other and having the same height, to be electrically connected to each other. The body patterns 182 may be disposed on the connection patterns 170. The connection patterns 170 may allow the body patterns 182 to be electrically connected to the first lower contact plugs 169a and the second lower contact plugs 169b.

Figure 9B:
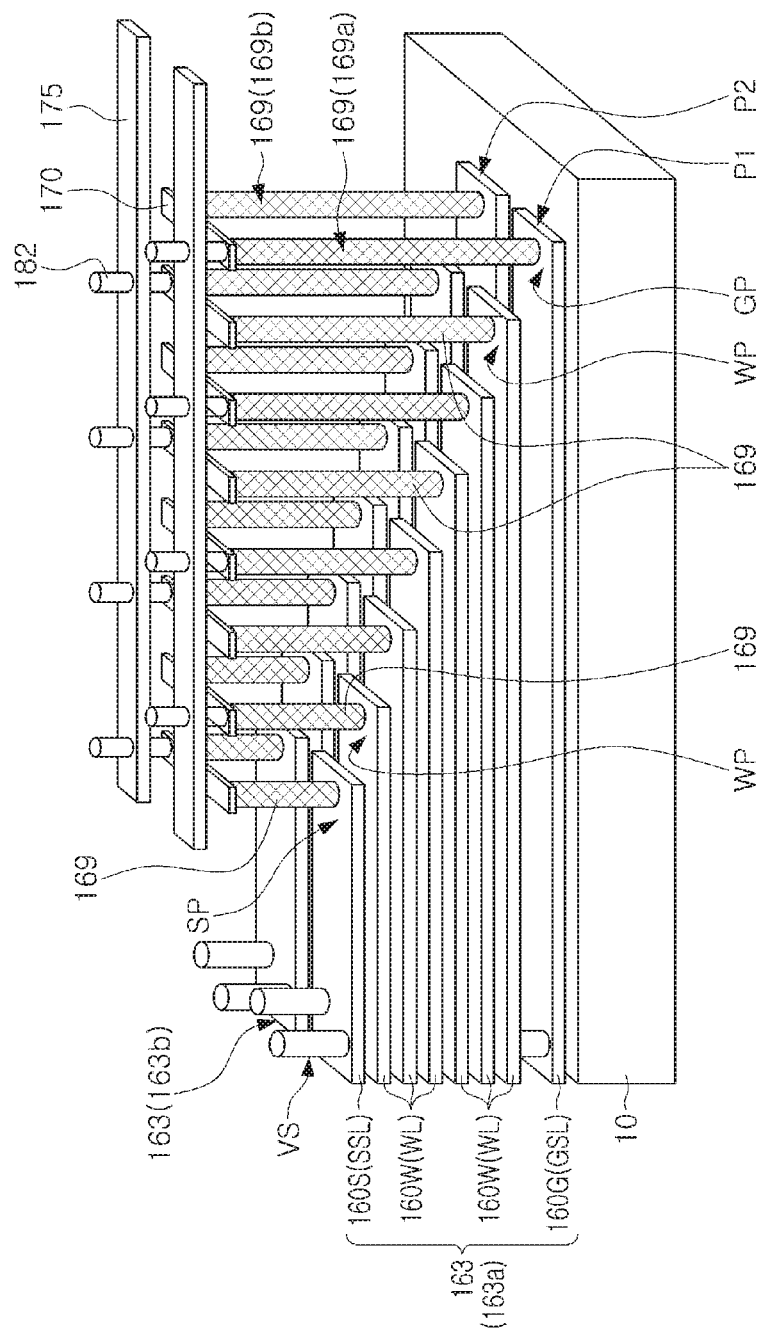
Figure 9C:
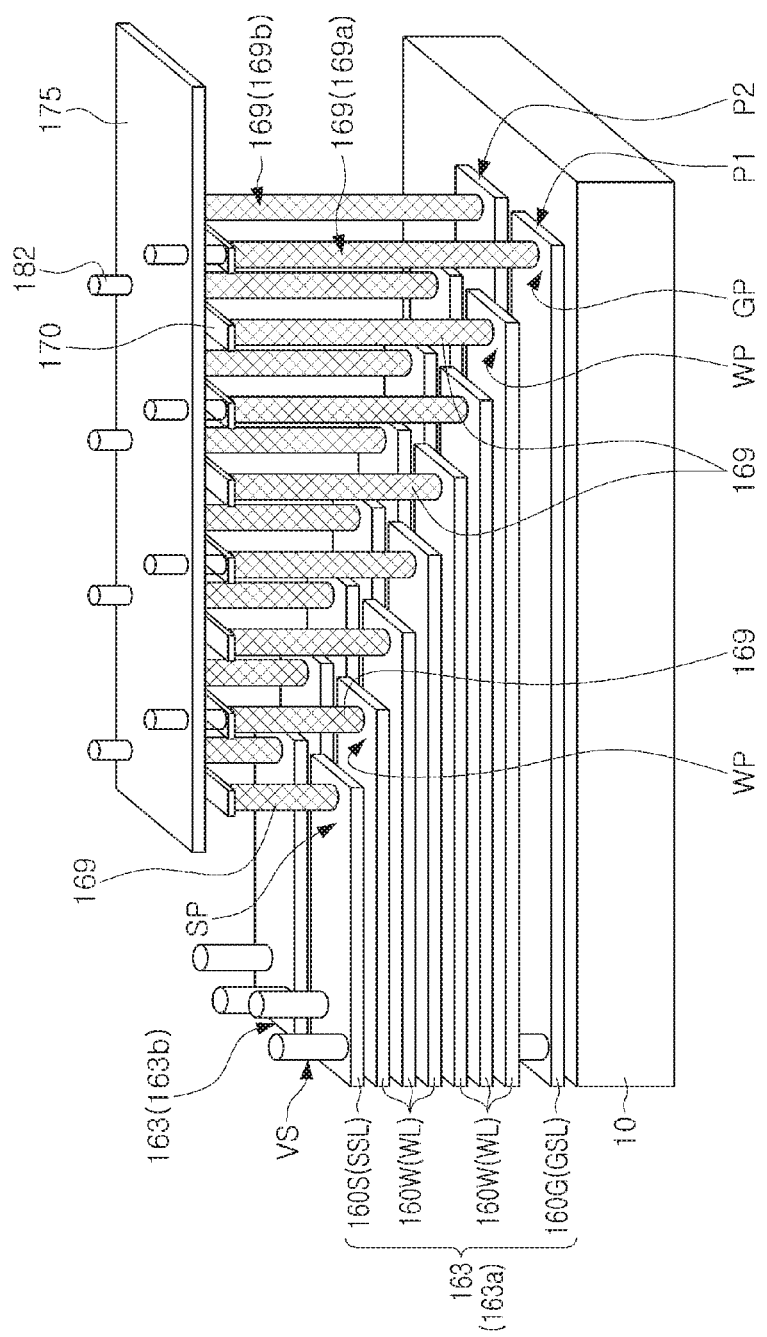

The body patterns 182 may be arranged in a line, and the body patterns 182 arranged in a line as described above may pass through one upper peripheral gate electrode 175. However, inventive concepts are not limited thereto. For example, as illustrated in FIG. 9B, body patterns (182 of FIG. 9B) may be arranged in zigzag on the connection patterns 170. Upper peripheral gate electrodes (175 of FIG. 9B) may be provided as a plurality of upper peripheral gate electrodes to overlap body patterns 182 arranged in a line, of body patterns (182 of FIG. 9B) arranged in zigzag. However, inventive concepts are not limited thereto. For example, as illustrated in FIG. 9C, body patterns (182 of FIG. 9B) arranged in zigzag may pass through one upper peripheral gate electrode (175 of FIG. 9C).

Figure 10:
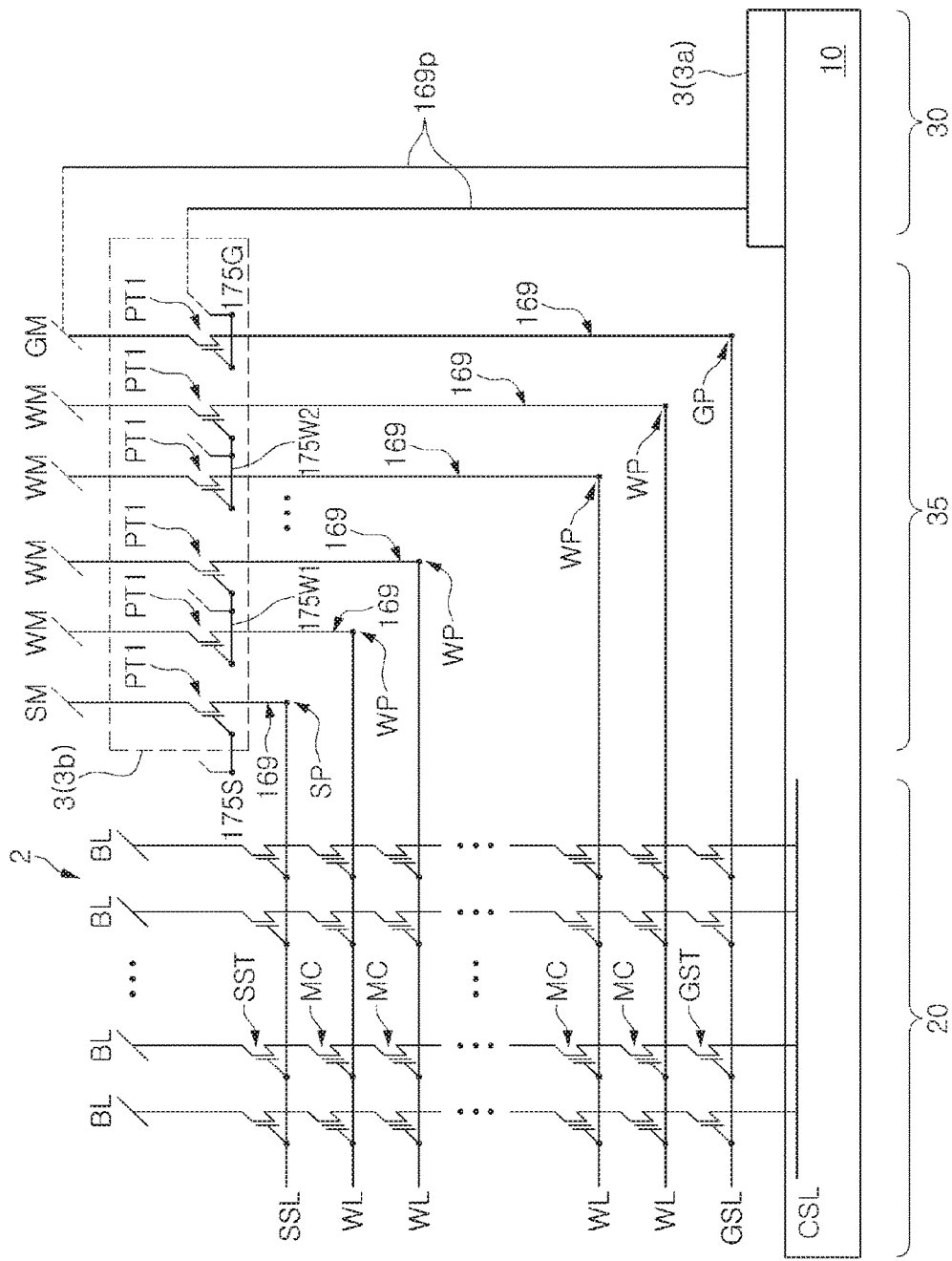
FIG. 10 is a view illustrating a semiconductor device according to some example embodiments.
Figure 11:
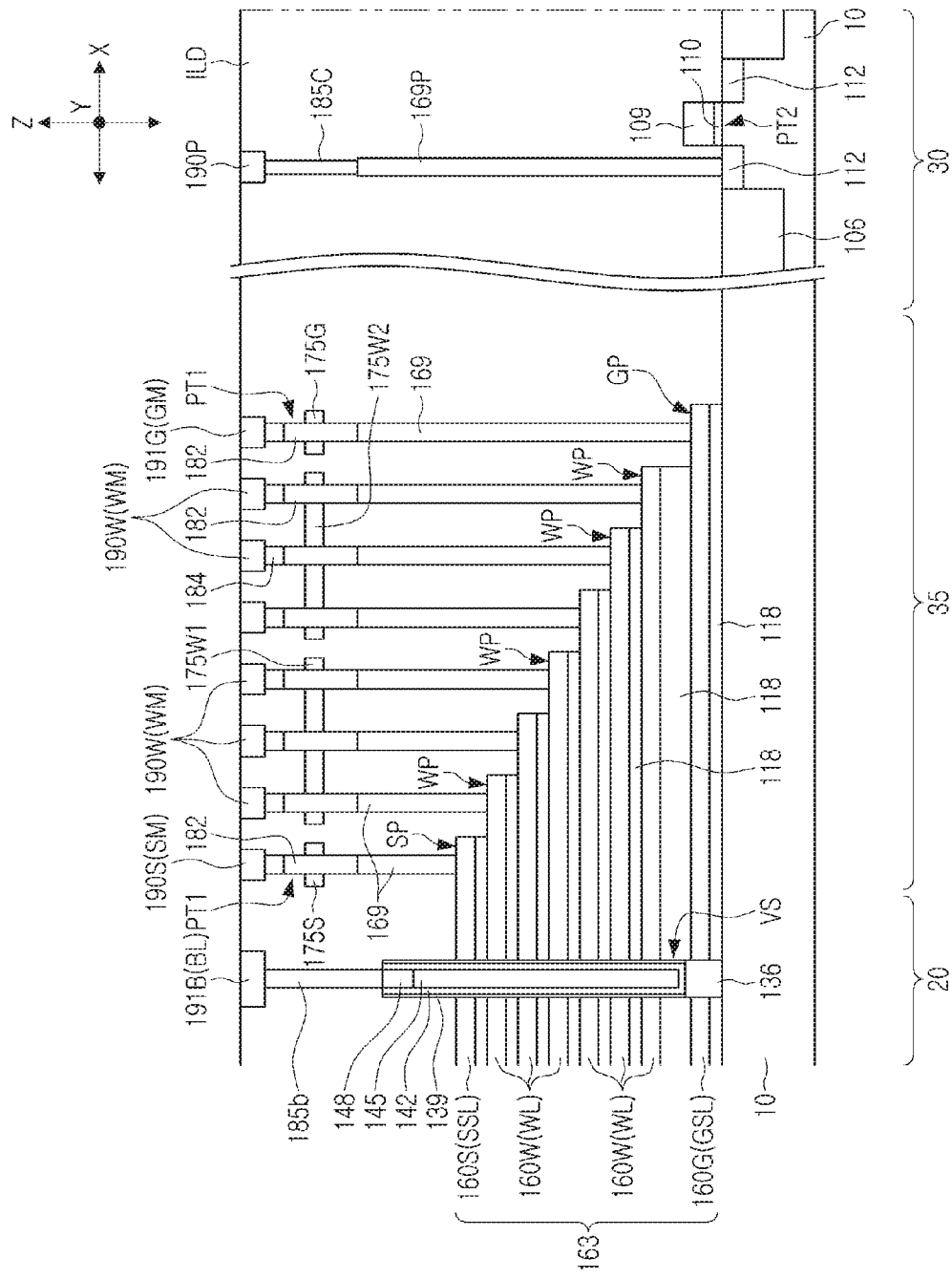
FIG. 11 is a cross-sectional view illustrating a semiconductor device according to some example embodiments.

As described, along with FIGS. 1 and 2, with reference to FIGS. 3A and 3B, the upper peripheral transistors PT1 may share the upper peripheral gate electrode 175. Thus, through the upper peripheral gate electrode 175, the upper peripheral transistors PT1 may be turned on or turned off at the same time. However, inventive concepts are not limited thereto. For example, as illustrated in FIGS. 10 and 11, the upper peripheral gate electrode 175 is divided into a plurality of upper peripheral gate electrodes in a longitudinal direction of a bit line BL to allow the upper peripheral transistors PT1 to be electrically isolated from each other. An example described above will be described with reference to FIGS. 10 and 11. FIG. 10 is a view conceptually illustrating, an equivalent circuit of a memory cell array 2 disposed on a semiconductor substrate and a row decoder circuit region 3 disposed on a semiconductor substrate 10, in order to illustrate the arrangement relationship of the memory cell array 2 and the row decoder circuit region 3, disposed on the semiconductor substrate 10, and FIG. 11 is a cross-sectional view illustrating a region taken in a longitudinal direction X of a word line WL, in order to illustrate a portion of the memory cell array 2 and a portion of the row decoder circuit region 3.

With reference to FIGS. 10 and 11, the upper peripheral gate electrode 175 may be divided into an upper peripheral gate electrode 175W1 and a lower peripheral gate electrode 175W2. The upper peripheral gate electrode 175W1 may form upper peripheral transistors with body patterns 182 electrically connected to pad regions of cell gate electrodes, located in an upper portion, of the plurality of cell gate electrodes 160W. The lower peripheral gate electrode 175W2 may form upper peripheral transistors with body patterns 182 electrically connected to pad regions of cell gate electrodes, located in a lower portion, of the plurality of cell gate electrodes 160W.

The upper peripheral gate electrode 175 may be divided into an upper select peripheral gate electrode 175S and a lower select peripheral gate electrode 175G, in addition to the upper peripheral gate electrode 175W1 and the lower peripheral gate electrode 175W2. The upper select peripheral gate electrode 175S may form upper peripheral transistors PT1 with a body pattern 182 electrically connected to a pad region SP of the upper gate electrode 160S, and the lower select peripheral gate electrode 175G may form upper peripheral transistors PT1 with a body pattern 182 electrically connected to a pad region GP of the lower gate electrode 160G.

Thus, since the upper peripheral gate electrode 175 is electrically divided into a plurality of upper peripheral gate electrodes, among the plurality of memory cells MC of the memory cell array 2, a plurality of memory cells located in a lower portion and a plurality of memory cells located in an upper portion may be respectively controlled. In addition, the string select transistor SST and the ground select transistor GST may be respectively controlled.

As described above, since the plurality of memory cells MC are divided and controlled, degradation of dispersion characteristics between upper cells and lower cells, which may occur by gradually increasing the number of the plurality of memory cells MC stacked in a vertical direction, may be improved, thereby improving dispersion characteristics of a semiconductor device.

Figure 12A:
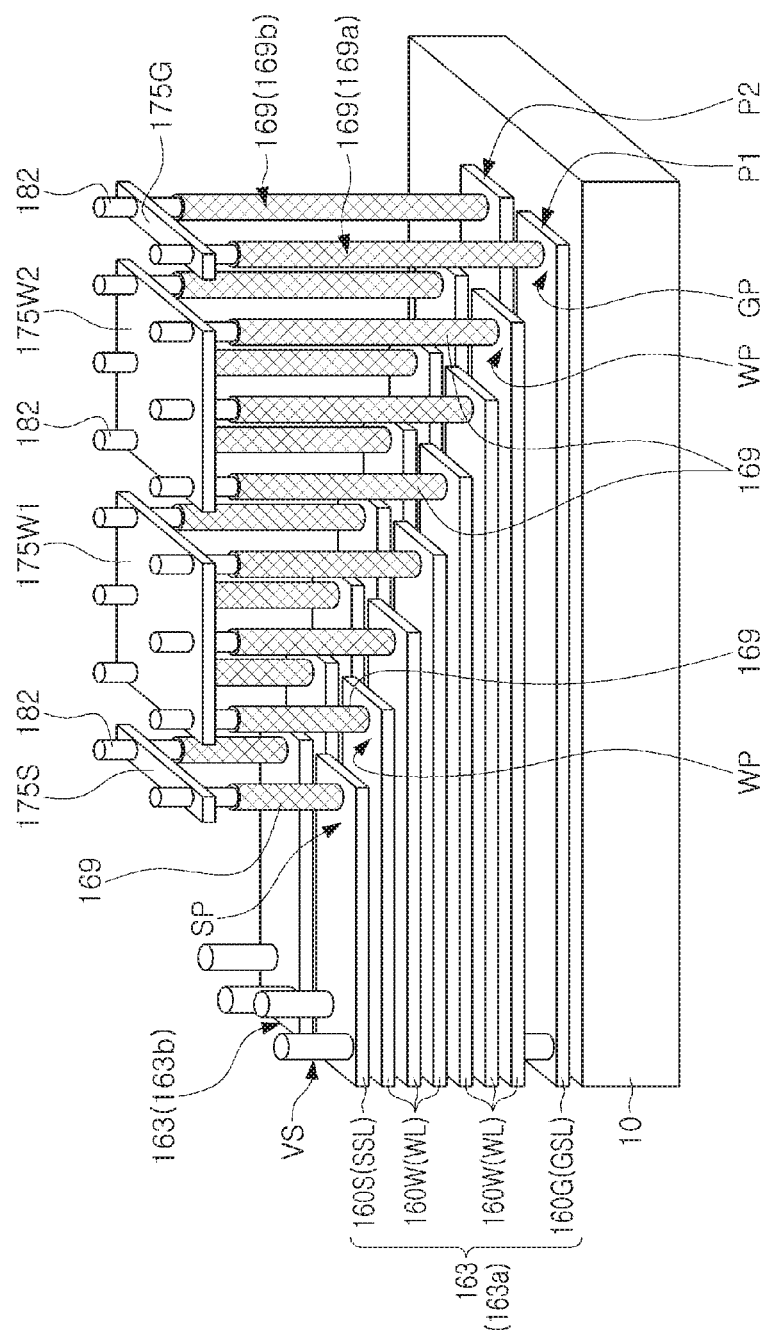
FIGS. 12A, 12B, and 12C are perspective views illustrating various examples of a semiconductor device according to some example embodiments.
Figure 12B:
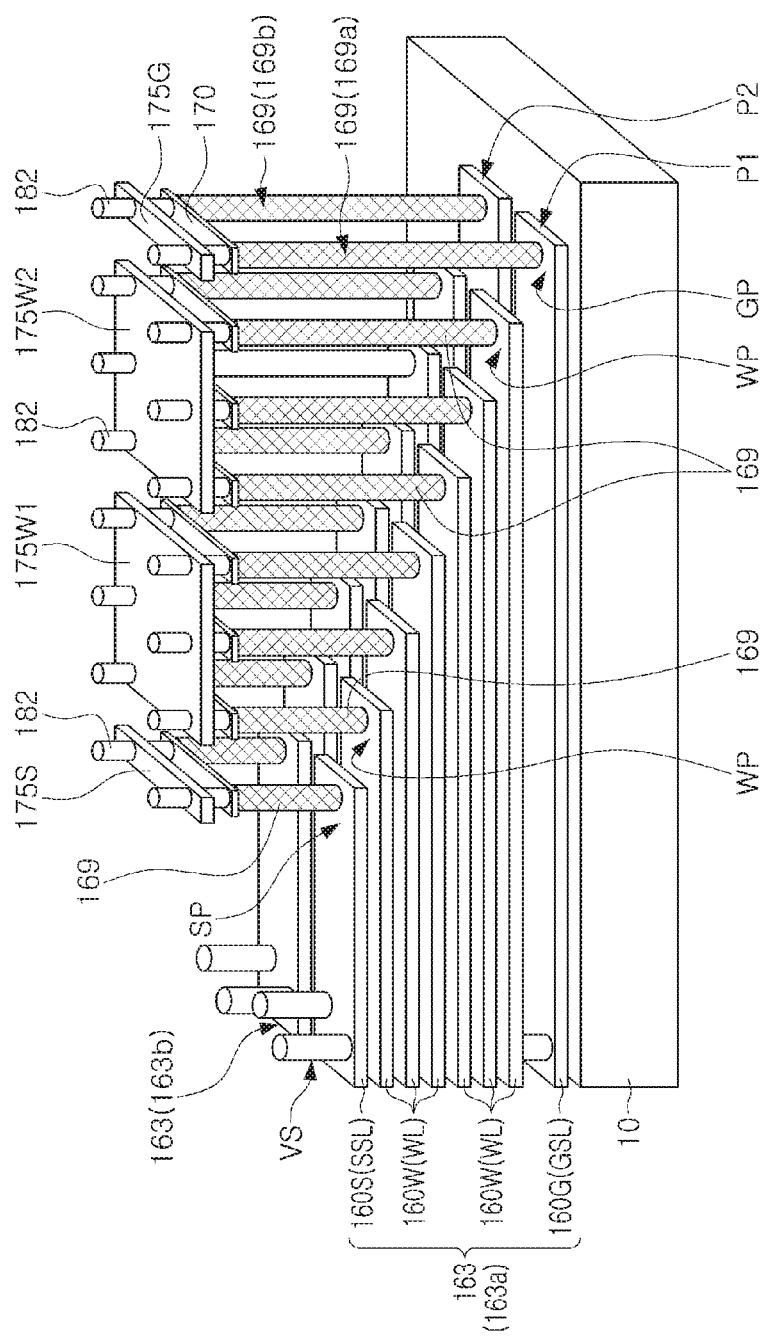
Figure 12C:
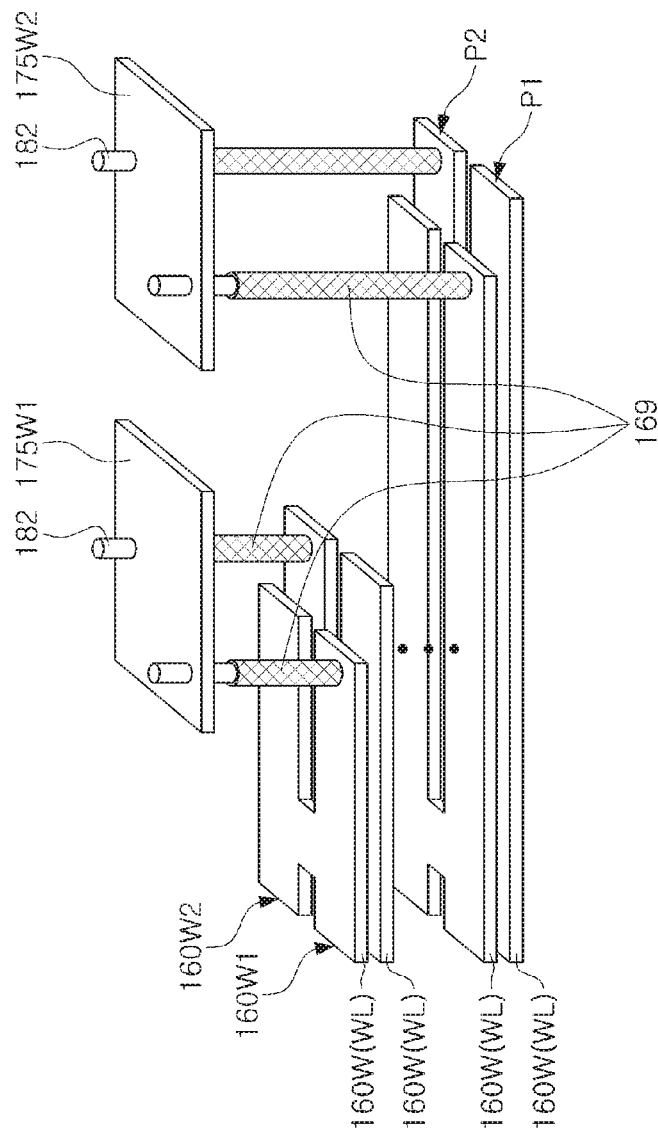

The body patterns 182 and the pad regions SP, WP, and GP may be electrically connected to each other by various paths, as described with reference to FIGS. 7A, 7B, 8A, 8B, 9A, 9B, and 9C. Examples as described above will be described with reference to FIGS. 12A, 12B, and 12C. FIGS. 12A, 12B, and 12C are perspective views illustrating various modifications examples of a semiconductor device.

With reference to FIG. 12A, the upper peripheral gate electrode 175 may be divided as illustrated in FIGS. 10 and 11, and the body patterns 182 and the pad regions SP, WP, and GP may be electrically connected to each other through the lower contact plugs 169 as illustrated in FIG. 7A.

With reference to FIG. 12B, the upper peripheral gate electrode 175 may be divided as illustrated in FIGS. 10 and 11, and the body patterns 182 and the pad regions SP, WP, and GP may be electrically connected to each other through the lower contact plugs 169 and the connection patterns 170 as illustrated in FIG. 9C.

With reference to FIG. 12C, as illustrated in FIG. 8B, portions of a plurality of gate-stack structures 163 adjacent to each other may be connected to each other, and the body patterns 182 may be electrically connected to pad regions of the gate-stack structure 163 the same as illustrated in FIG. 8B through the lower contact plugs 169.

Figure 13:
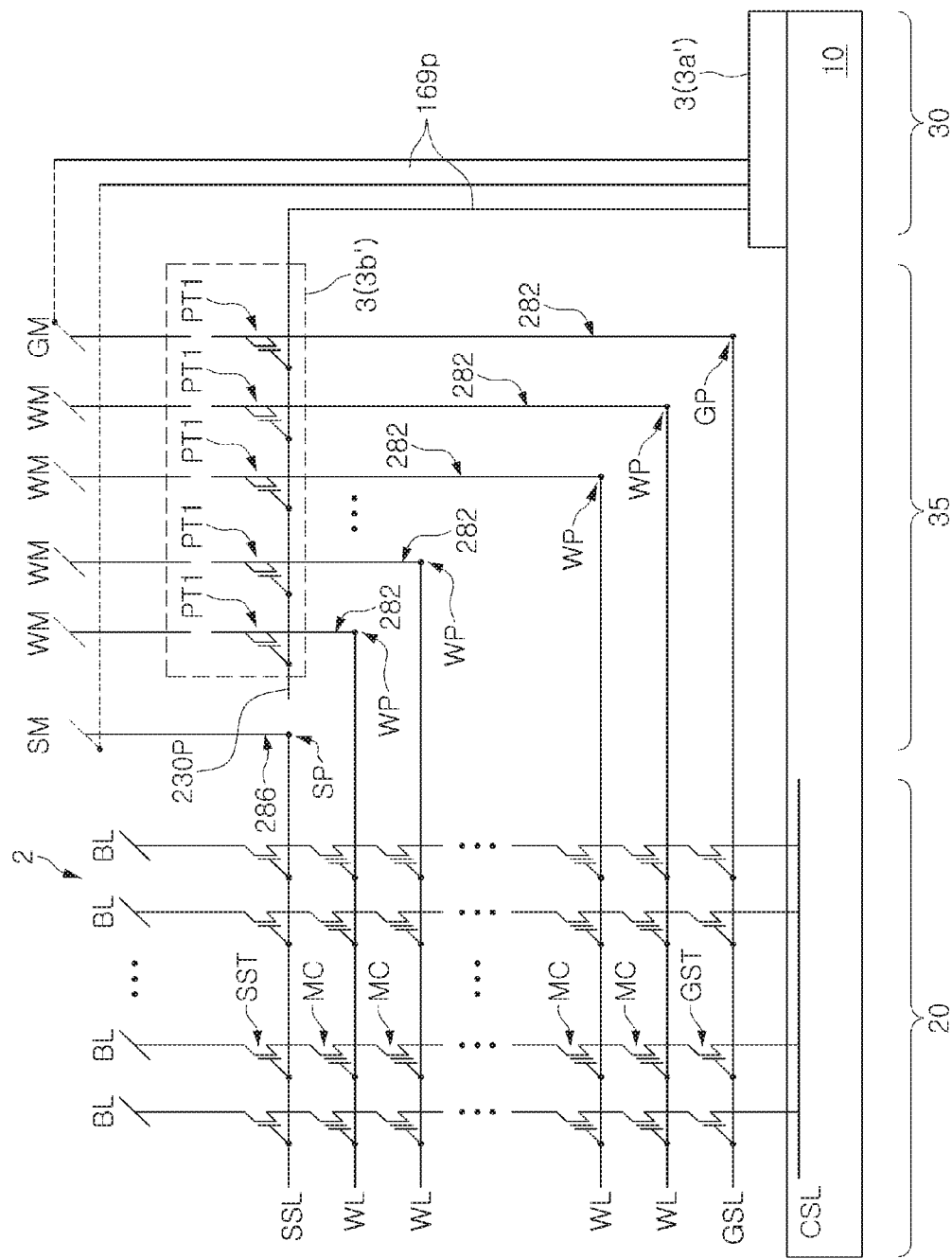
FIG. 13 is a view illustrating a semiconductor device according to some example embodiments.

Next, with reference to FIGS. 13, 14, and 15, a modified example of a semiconductor device according to some example embodiments will be described. FIG. 13 is a view conceptually illustrating an equivalent circuit of a memory cell array 2 disposed on a semiconductor substrate 10 and a row decoder circuit region 3 disposed on the semiconductor substrate to illustrate the arrangement relationship of the memory cell array 2 and the row decoder circuit region 3 disposed on the semiconductor substrate 10, FIG. 14 is a cross-sectional view illustrating a region taken in a longitudinal direction X of a word line WL to illustrate a portion of the memory cell array 2 and a portion of the row decoder circuit region 3, and FIG. 15 is a perspective view illustrating a modified example of a semiconductor device according to some example embodiments.

Figure 14:
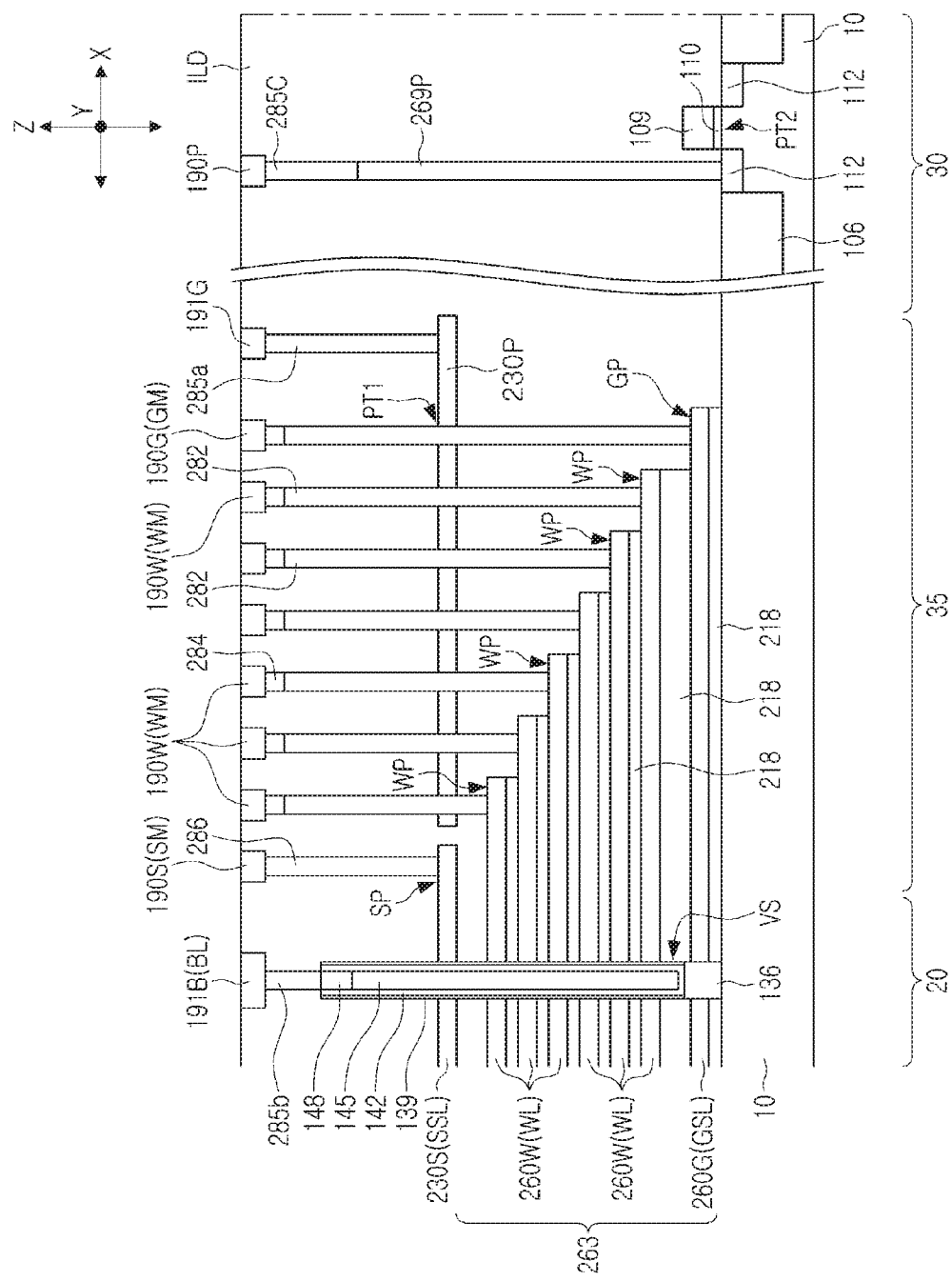
FIG. 14 is a cross-sectional view illustrating a semiconductor device according to some example embodiments.
Figure 15:
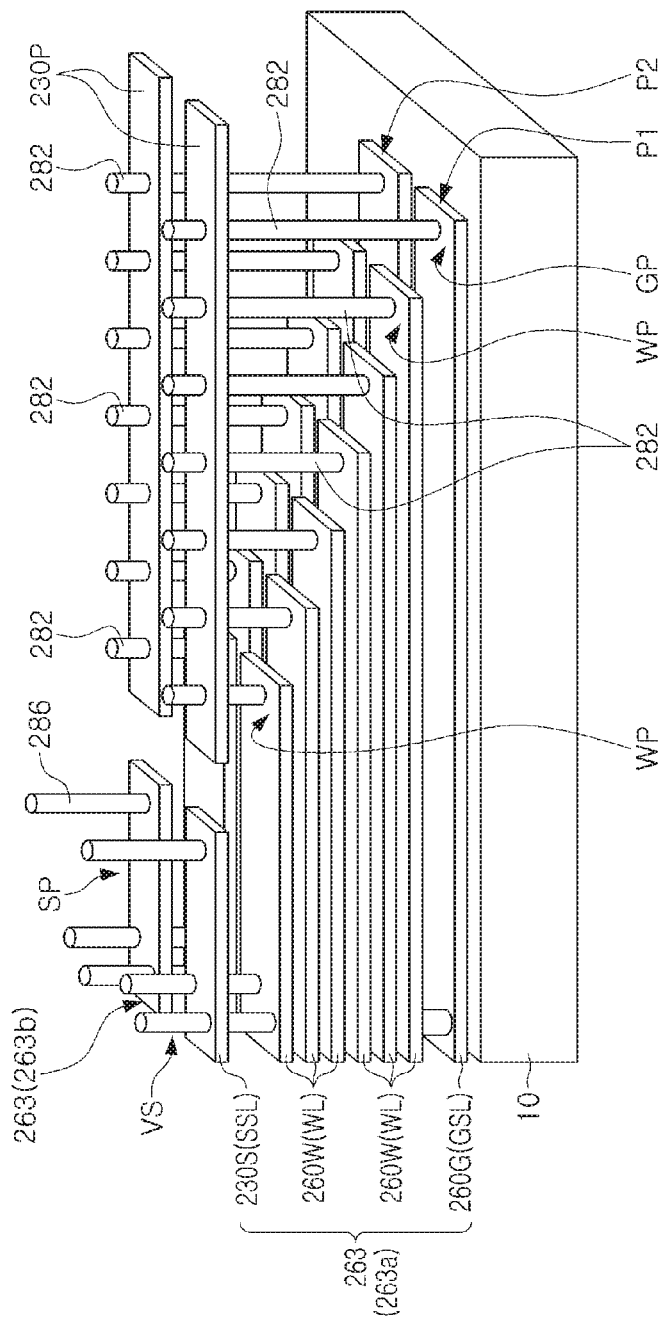
FIGS. 15 and 16 are perspective views illustrating various examples of a semiconductor device according to some example embodiments.

With reference to FIGS. 13, 14, and 15, the semiconductor substrate 10 may have the first region 20 and the second region 30 and the middle region 35, the same as illustrated with reference to FIGS. 1 to 12C. The memory cell array 2 the same as illustrated with reference to FIGS. 1 to 12C may be disposed in the first region 20 of the semiconductor substrate 10. A gate electrode structure 263 having a structure the same as that of the gate-stack structure 163 illustrated with reference to FIGS. 1 to 12C may be disposed in the first region 20 of the semiconductor substrate 10.

The gate electrode structure 263 may include an upper gate electrode 230S which may be a string select line SSL, a lower gate electrode 260G which may be a ground select line GSL, and cell gate electrodes 260W disposed between the upper gate electrode 230S and the lower gate electrode 260G and which may be word lines WL. The upper gate electrode 230S, the cell gate electrodes 260W, and the lower gate electrode 260G of the gate electrode structure 263 may include pad regions SP, WP, and GP formed to be extended from the first region 20 to the middle region 35.

The lower gate electrode 260G and the cell gate electrodes 260W may be formed of the same material (e.g., titanium nitride (TiN), tungsten (W), or the like), and the upper gate electrode 230S may be formed of a material (e.g., polysilicon, or the like) different from the lower gate electrode 260G and the cell gate electrodes 260W.

An upper circuit 3b' of the row decoder circuit region (3 of FIG. 1) may be disposed in the middle region 35 of the semiconductor substrate 10, and a lower circuit 3a' of the row decoder circuit region (3 of FIG. 1) may be disposed in the second region 30 of the semiconductor substrate 10.

The upper circuit 3b' of the row decoder circuit region 3 disposed in the middle region 35 of the semiconductor substrate 10 may include upper peripheral transistors PT1.

The upper peripheral transistors PT1 may include an upper peripheral gate electrode 230P disposed on the same plane as the upper gate electrode 230S, body patterns 282 passing through the upper peripheral gate electrode 230P and electrically connected to pad regions WP and GP of the cell gate electrodes 260W and the lower gate electrode 260G, and a peripheral gate dielectric layer disposed between the body patterns 282 and the upper peripheral gate electrode 230P. The peripheral gate dielectric layer may be the same as one of the peripheral gate dielectric layers (180 of FIG. 5A, and 180' of FIG. 6) illustrated in FIGS. 5A and 6. Each of the body patterns 282 may be one of the body pattern (182 of FIG. 5A) illustrated in FIG. 5A and the body pattern (182' of FIG. 5B) illustrated in FIG. 5B.

The upper peripheral gate electrode 230P may be disposed on the same plane as the string select lines SSL, that is, the upper gate electrode 230S, and may be formed of the same material, for example, polysilicon.

The upper gate electrode 230S, that is, the string select lines SSL may be electrically connected to a lower peripheral transistor PT2 inside the lower circuit 3a formed in the second region 30 of the semiconductor substrate 10. The lower peripheral transistor PT2 may be disposed on a level lower than that of the upper peripheral transistor PT1.

Figure 16:
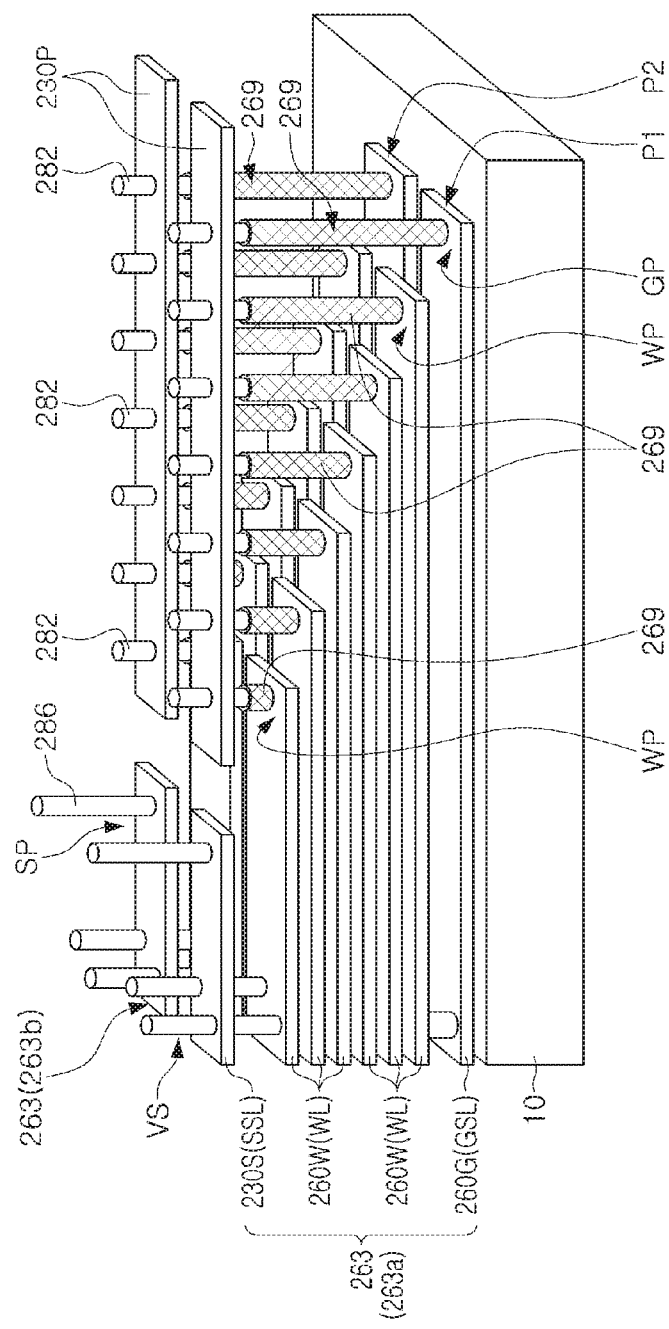

The body patterns 282 may be electrically connected to the pad regions WP and GP of the cell gate electrodes 260W and the lower gate electrode 260G through lower contact plugs (269 of FIG. 16), as illustrated in FIG. 16. The lower contact plugs 269 may be formed of a metal material such as tungsten (W), or the like. Side surfaces of the lower contact plugs 269 may be self-aligned with side surfaces of the body patterns 282.

On the semiconductor substrate 10, a string line wiring 190S (SM) which may be electrically connected to the string select line SSL through a contact plug 286, word line wirings 190W (WM) which may be electrically connected to the word lines WL through contact plugs 284, a ground line wiring 190G (GM) which may be electrically connected to the ground select lines GSL through a contact plug 284, an upper peripheral gate wiring 191G which may be electrically connected to the upper peripheral gate electrode 230P through a contact plug 285a, and a bit line 191B (BL) which may be electrically connected to a drain 148 of a vertical structure VS through a contact plug 285b, may be disposed thereon. In addition, on the semiconductor substrate 10, a peripheral wiring 190P which may be electrically connected to the lower peripheral transistor PT2 through contact plugs 269P and 285C may be disposed thereon.

In some example embodiments, the body patterns 282 may pass through the upper peripheral gate electrode 230P and may be in contact with pad regions WP and GP of the cell gate electrodes 260W and the lower gate electrode 260G. However, inventive concepts are not limited thereto. For example, as illustrated in FIG. 16, lower contact plugs (269 of FIG. 16) may disposed between pad regions WP and GP of the cell gate electrodes 260W and the lower gate electrode 260G and the body patterns 282, and the body patterns 282 may be electrically connected to the pad regions WP and GP through the lower contact plug (269 of FIG. 16).

In some example embodiments, the upper peripheral gate electrode 230P of the upper peripheral transistors PT1 may be divided. An example described above will be described with reference to FIGS. 17 and 18.

Figure 17:
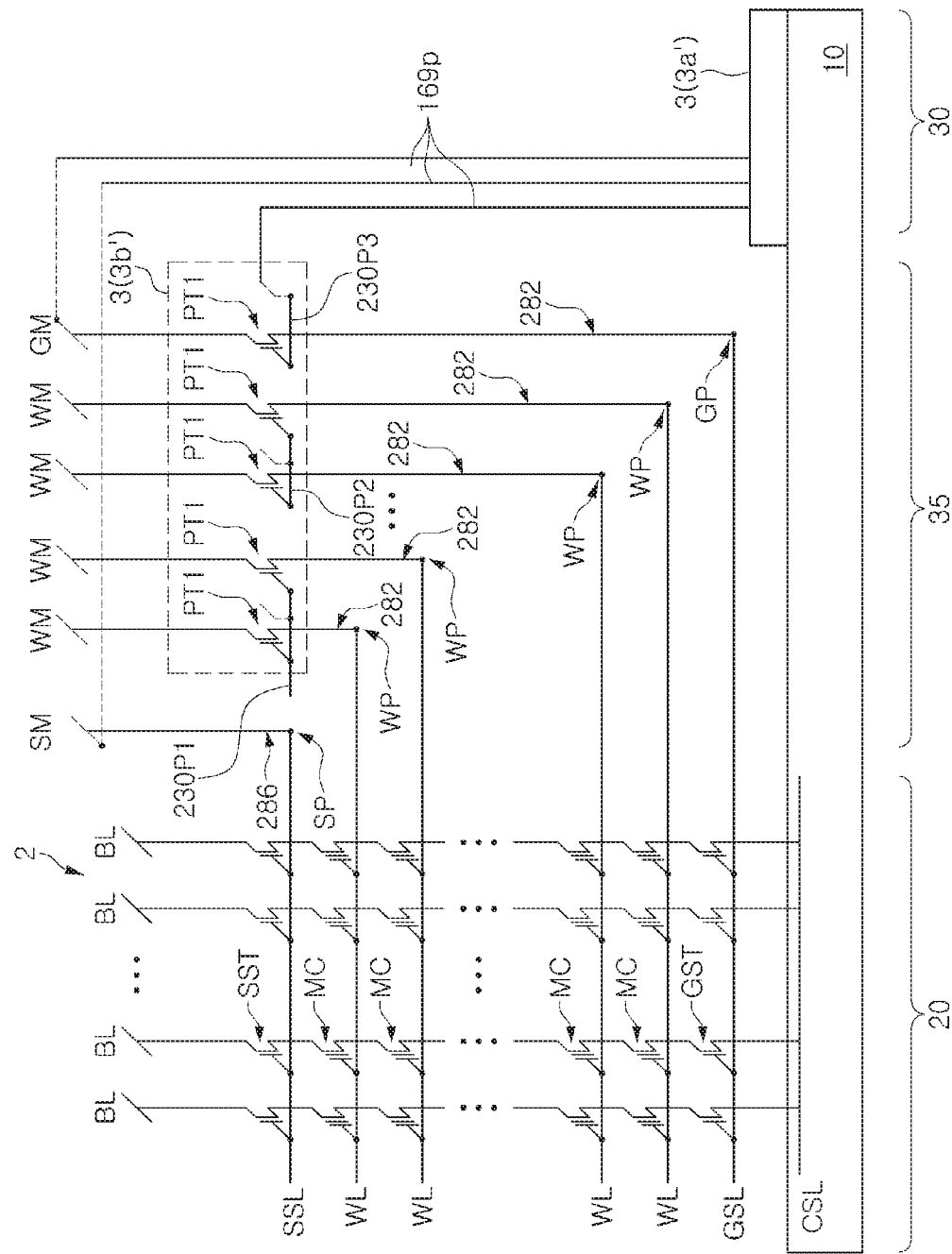
FIG. 17 is a view illustrating a semiconductor device according to some example embodiments.
Figure 18:
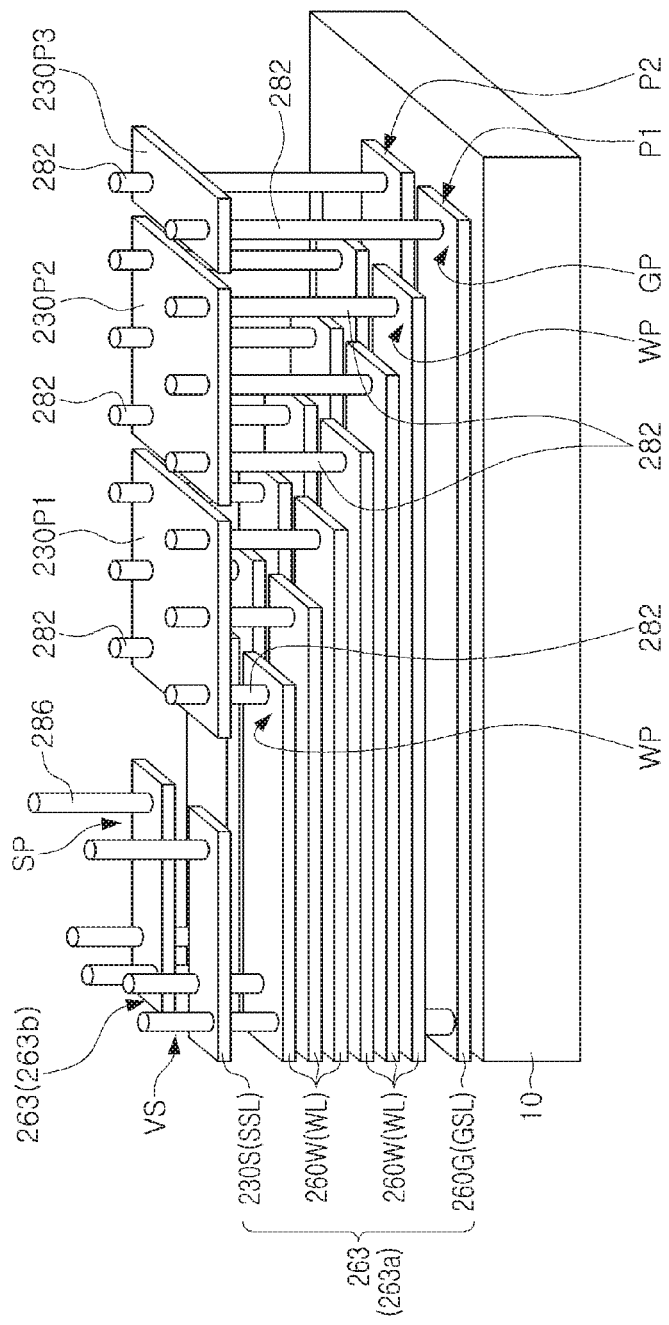
FIGS. 18 and 19 are perspective views illustrating various examples of a semiconductor device according to some example embodiments.

With reference to FIGS. 17 and 18, the upper peripheral gate electrode 230P may be divided into an upper peripheral gate electrode 230P1 and a lower peripheral gate electrode 230P2 spaced apart from each other. The upper peripheral gate electrode 230P1 may form upper peripheral transistors with body patterns 282 electrically connected to pad regions of cell gate electrodes located in an upper portion of a plurality of cell gate electrodes 260W. The lower peripheral gate electrode 230P2 may form upper peripheral transistors with body patterns 282 electrically connected to pad regions in a lower portion of the plurality of cell gate electrodes 260W.

Moreover, the upper peripheral gate electrode 230P may be divided into a lower select peripheral gate electrode 230P3, in addition to the upper peripheral gate electrode 230P1 and the lower peripheral gate electrode 230P2. The lower select peripheral gate electrode 230P3 may form an upper peripheral transistor PT1 with a body pattern 282 electrically connected to a pad region GP of the lower gate electrode 260G.

Figure 19:
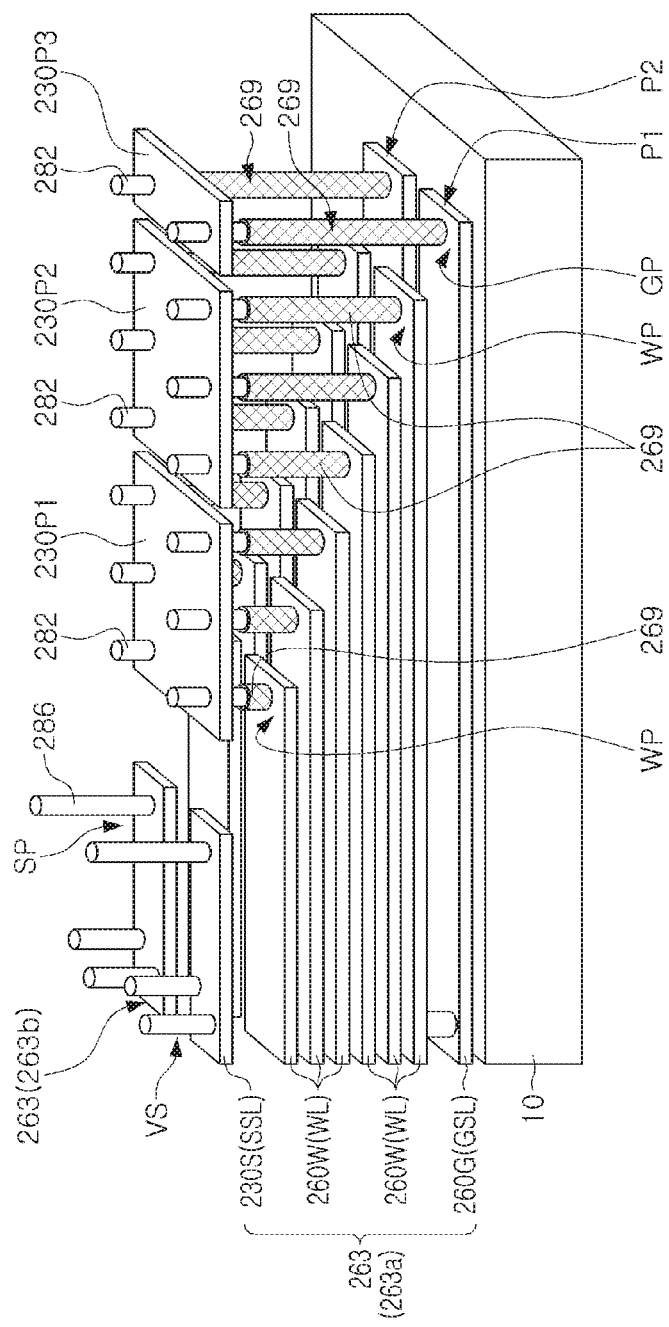

Meanwhile, as illustrated in FIG. 19, lower contact plugs 269 for electrically connecting the body patterns 282 to the pad regions GP and WP may be provided.

Figure 20:
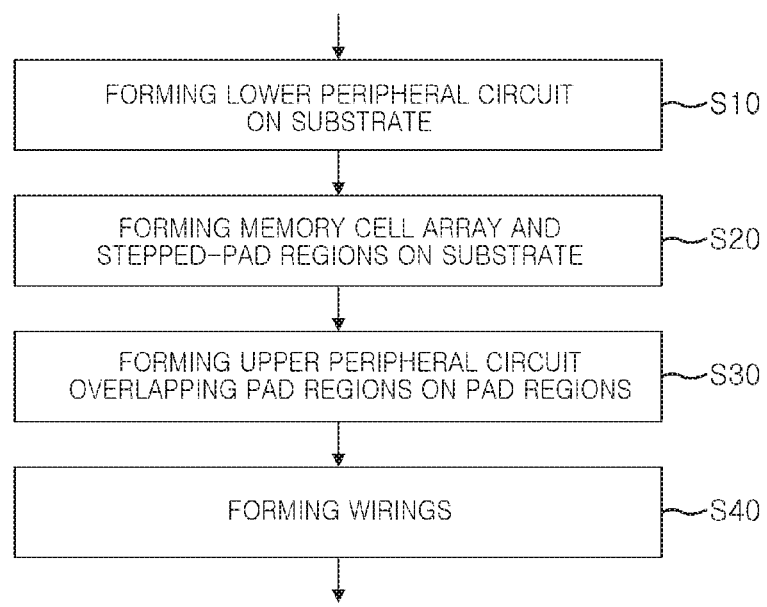
FIG. 20 is a process flow chart illustrating an example of a method of forming a semiconductor device according to some example embodiments.

Hereinafter, an example of a method of forming of the semiconductor device 1 illustrated with reference to FIGS. 1 and 2 will be described with reference to FIGS. 20 and 21A through 21d. FIG. 20 is a process flow chart illustrating an example of a method of forming a semiconductor device according to some example embodiments, and FIGS. 21A through 21D are cross-sectional views illustrating an example of a method of forming a semiconductor device according to some example embodiments.

Figure 21A:
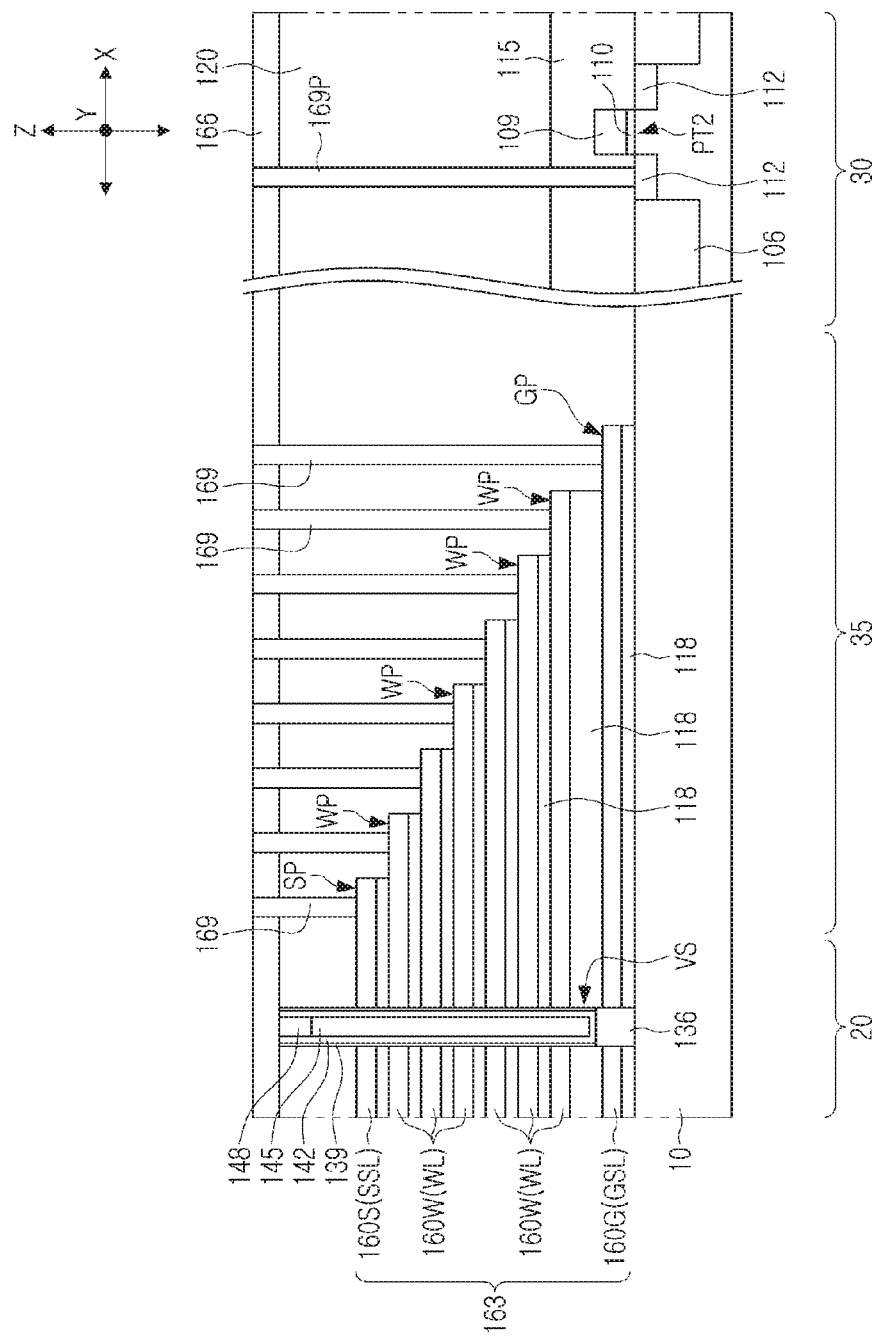
FIGS. 21A through 21D are cross-sectional views illustrating an example of a method of forming a semiconductor device according to some example embodiments.

Along with FIGS. 1 and 2, with reference to FIGS. 20 and 21A, a lower peripheral circuit may be formed on a substrate 10 (S10). The substrate 10 may be a semiconductor substrate. The substrate 10 may have a first region 20, a second region 30, and a middle region 35 disposed between the first region and the second region.

A lower peripheral transistor PT2 of the lower peripheral circuit may be formed on the second region 30 of the substrate 10. The lower peripheral transistor PT2 may be a planar MOS transistor including a gate 109 and a gate insulating layer 110 formed on the substrate 10, and a source/drain 112 formed inside the substrate defined by a device isolation region 106. An interlayer insulating layer 115 covering the lower peripheral transistor PT2 may be formed. The source/drain 112 may be referred to as an impurity region 112.

On the substrate 10, a memory cell array (2 of FIGS. 1 and 2) and pad regions SP, WP, and GP may be formed thereon (S20).

The memory cell array (2 of FIGS. 1 and 2) may include a gate-stack structure 163 disposed on the first region 20 of the substrate 10 and a vertical structure VS passing through the gate-stack structure 163.

The gate-stack structure 163 may include a lower gate electrode 160G, cell gate electrodes 160W on the lower gate electrode 160G, and an upper gate electrode 160S on the cell gate electrodes 160W. In lower portions of respective gate electrodes 160G, 160W, and 160S, interlayer insulating layers 118 may be formed therein. The gate electrodes 160G, 160W, and 160S may have stepped-pad regions SP, WP, and GP formed to be extended from the first region 20 of the substrate 10 to the middle region 35 thereof. The gate electrodes 160G, 160W, and 160S may be formed of a metallic material (e.g., TiN and/or W, or the like). An interlayer insulating layer 120 covering the gate-stack structure 163 and the lower peripheral transistor PT2 may be provided.

The vertical structures VS may be formed to pass through the interlayer insulating layer 120, the gate-stack structure 163, and the interlayer insulating layers 118. Each of the vertical structures VS may include a semiconductor pattern 136, a core pattern 145, a drain 148, a channel layer 142, and a dielectric structure 139. The channel layer 142 may be formed to have a cylinder shape of which the inside is empty while passing through the upper cell gate electrode 160S and the cell gate electrodes 160W which may correspond to word lines WL and a string select line SSL of a memory cell array, the core pattern 145 may be embedded inside the channel layer 142, and the drain 148 may be connected to an upper region of the channel layer 142 and may be formed on the core pattern 145. The semiconductor pattern 136 may be formed below the channel layer 142 and may have a side surface opposing the lower gate electrode 160G which may correspond to a ground select line GSL of the memory cell array 2. A gate insulating layer may be formed between the semiconductor pattern 136 and the gate electrode 160G. The dielectric structure 139 may be formed to surround the side surface of the channel layer 142.

An interlayer insulating layer 166 covering the vertical structures VS and the interlayer insulating layer 120 may be provided.

On the middle region 35 of the substrate 10, lower contact plugs 169 passing through the interlayer insulating layers 166 and 120 to be electrically connected to the pad regions SP, WP, and GP may be formed thereon. The lower contact plugs 169 may be formed of a metallic material (e.g., TiN and/or W, or the like).

On the second region 30 of the substrate 10, a lower peripheral contact plug 169P passing through the interlayer insulating layers 166, 120, and 115 to be electrically connected to the lower peripheral transistor PT2 may be formed thereon.

Figure 21B:
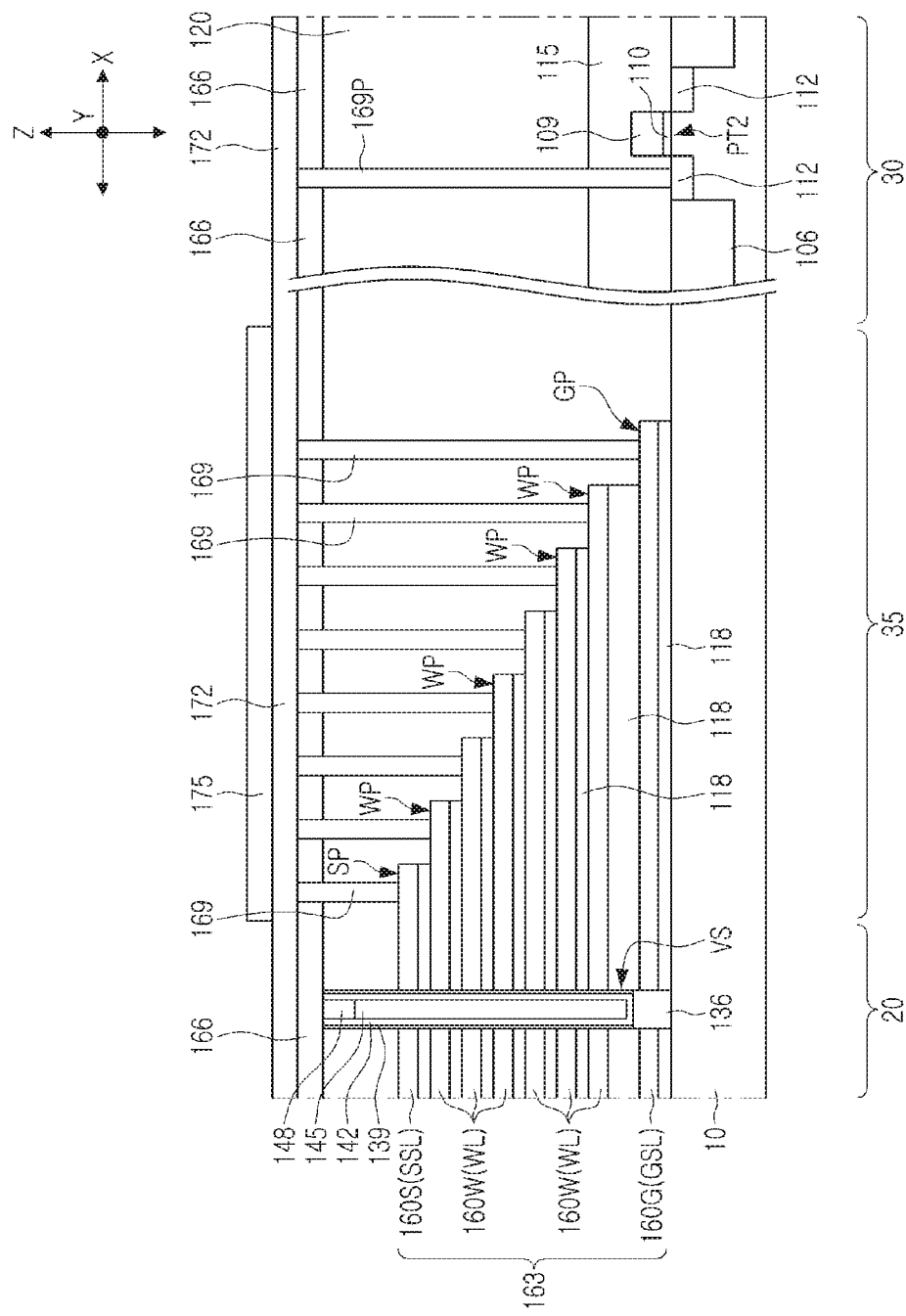

Along with FIGS. 1 and 2, with reference to FIGS. 20 and 21B, an interlayer insulating layer 172 may be formed above a resulting product. An upper peripheral gate electrode 175 may be formed above the interlayer insulating layer 172.

Figure 21C:
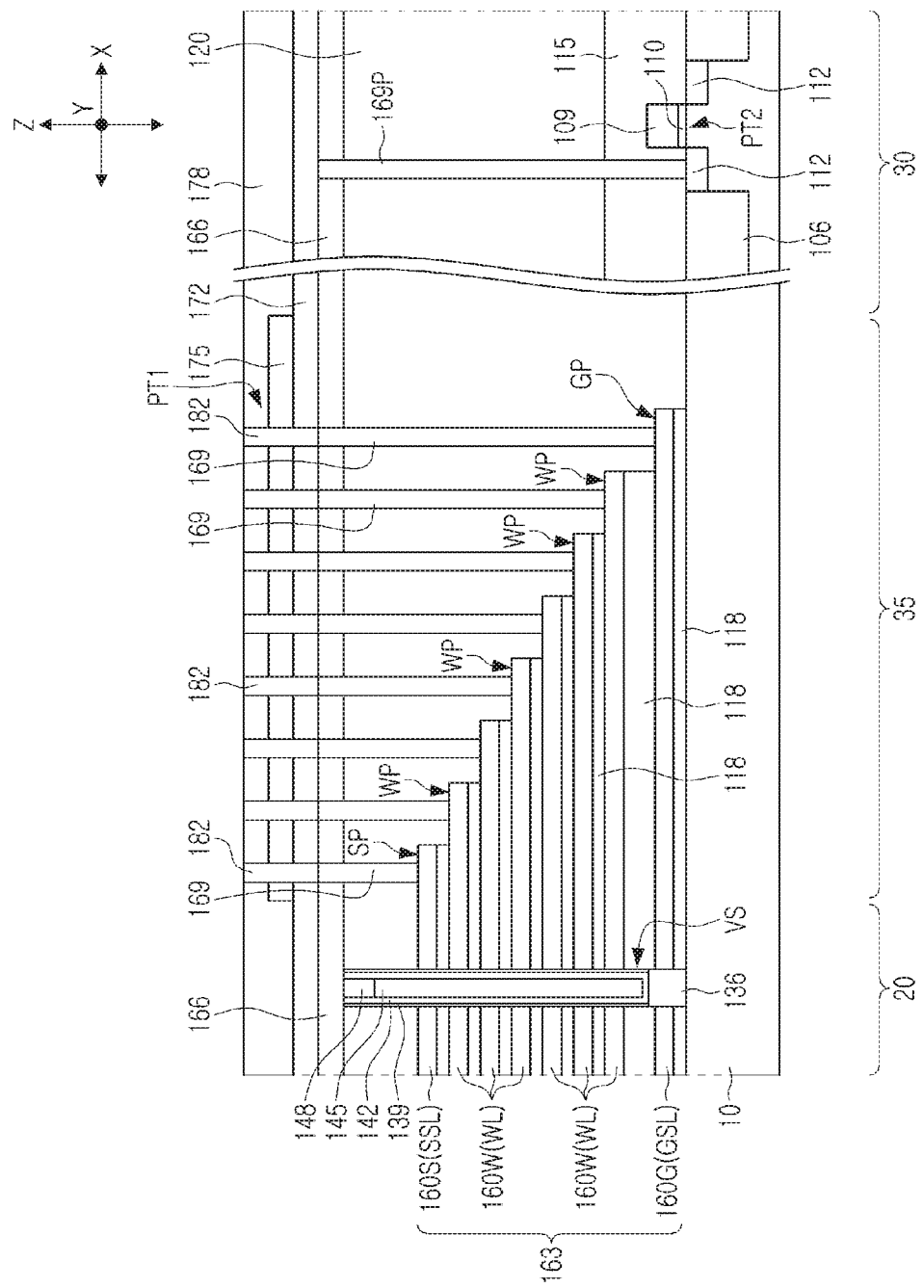

Along with FIGS. 1 and 2, with reference to FIGS. 20 and 21C, an interlayer insulating layer 178 covering the upper peripheral gate electrode 175 may be provided. Holes passing through interlayer insulating layers 178 and the upper peripheral gate electrode 175 to expose the lower contact plugs 169 may be formed, gate dielectric layers (180 of FIG. 5A) the same as illustrated in FIG. 5A, or gate dielectric layers (180' of FIG. 6) the same as illustrated in FIG. 5C may be formed inside the holes, and the body patterns (182 of FIG. 5A) the same as illustrated in FIG. 5A may be formed inside the holes. In a different example, inside the holes, the body patterns (182' of FIG. 5B), the insulating patterns (183 of FIG. 5B), and the pad portions (184 of FIG. 5B), the same as illustrated in FIG. 5B, may be formed therein.

In some example embodiments, forming the lower contact plugs 169 and the body patterns 182 may include forming the interlayer insulating layers 120, 166, and 178 and the upper peripheral gate electrode 175, forming preliminary lower contact plugs passing through the interlayer insulating layers 120, 166, and 178 and the upper peripheral gate electrode 175 and in contact with the pad regions SP, WP, and GP, forming lower contact plugs 169 formed on a level lower than that of the upper peripheral gate electrode 175 by etching-back the preliminary lower contact plugs, and forming the gate dielectric layers (180 of FIG. 5A) and the body patterns 182 inside empty spaces formed by etching-back the lower contact plugs 169.

Thus, on the pad regions SP, WP, and GP, upper peripheral circuit overlapping the pad regions SP, WP, and GP may be formed thereon (S30). Upper transistors PT1 of the upper peripheral circuit may include the upper peripheral gate electrode 175 and the body patterns 182.

Figure 21D:
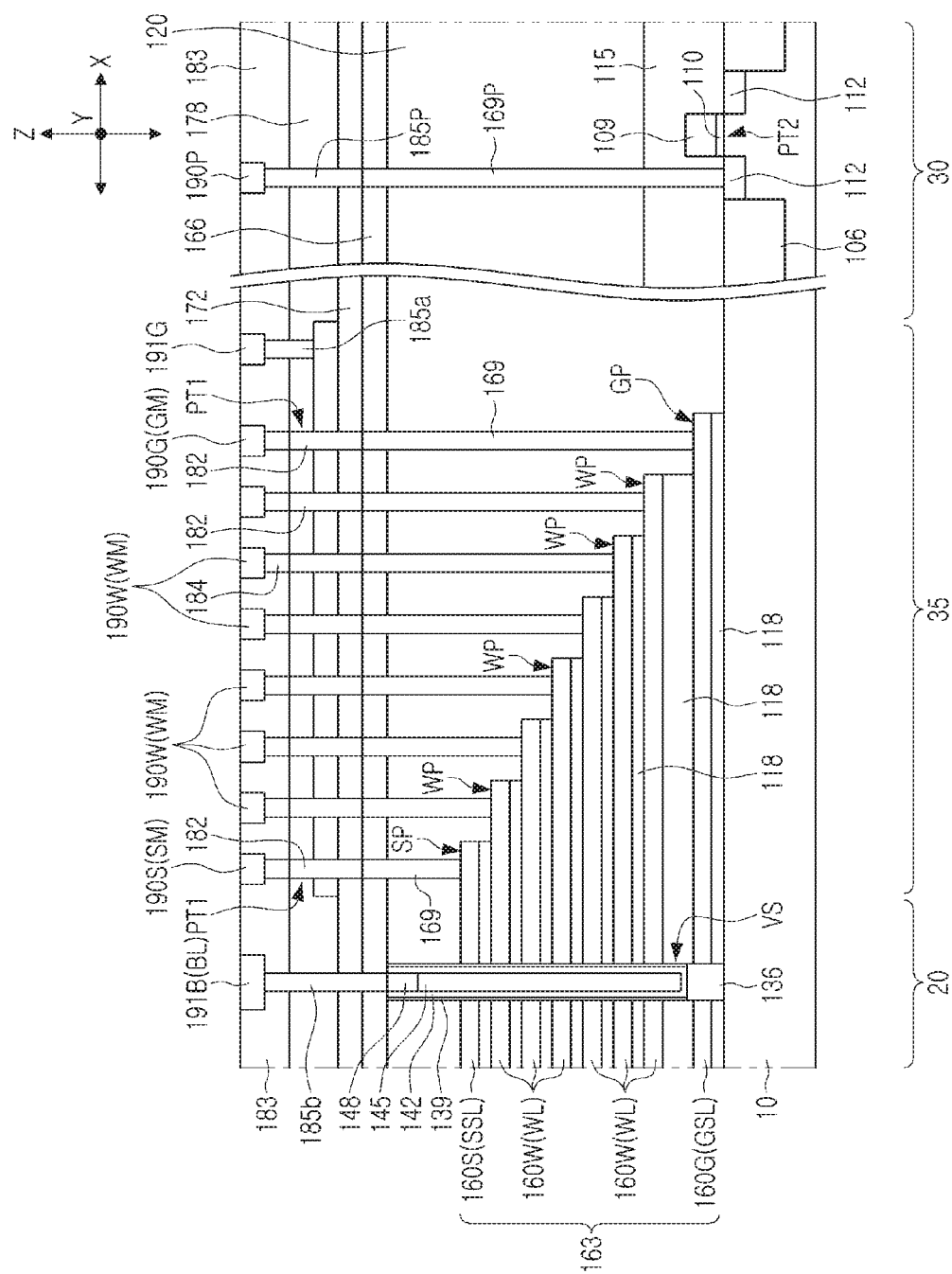

Along with FIGS. 1 and 2, with reference to FIGS. 20 and 21D, an interlayer insulating layer 183 may be formed on a substrate having the upper transistors PT1, and plugs 184, 185a, 185b, and 185P in addition to wirings 190S, 190W, 190G, 191, and 190P may be formed inside the interlayer insulating layer 183. In one example, the plugs 184, 185a, 185b, and 185P in addition to the wirings 191, 190S, 190W, 190G, 191, and 190P may be formed in a damascene process.

Figure 22:
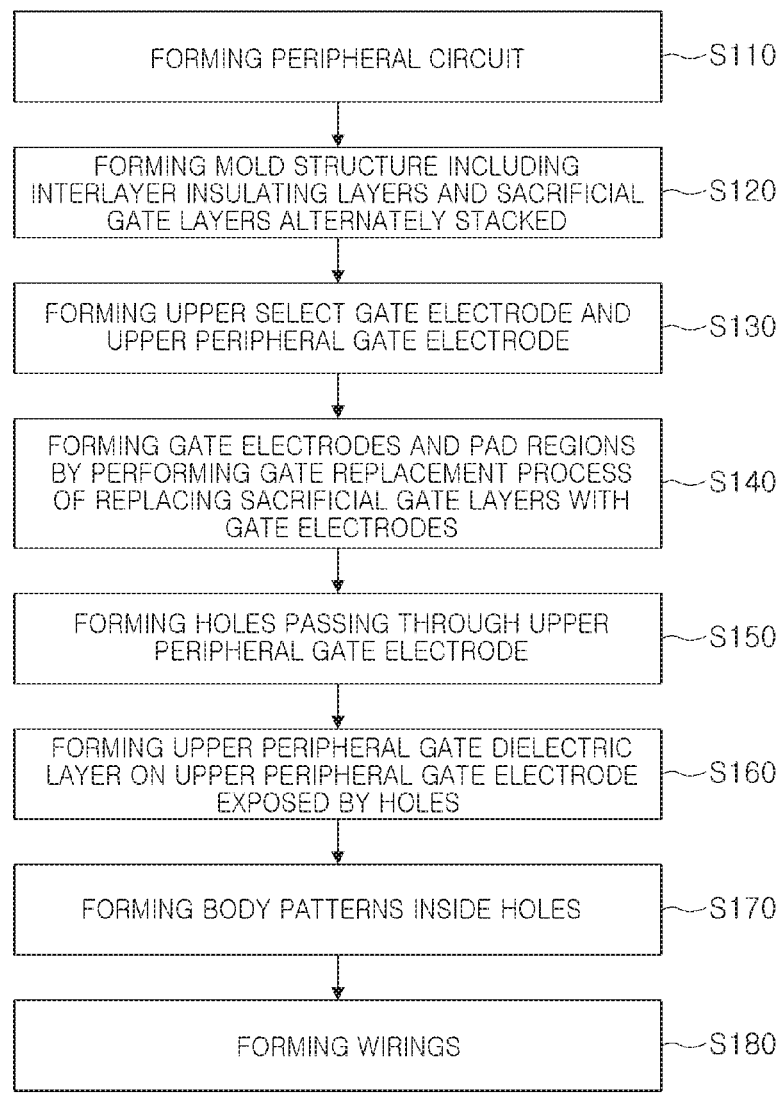
FIG. 22 is a process flow chart illustrating an example of a method of forming a semiconductor device according to some example embodiments.

Hereinafter, an example of a method of forming the semiconductor device illustrated with reference to FIGS. 13 and 14 will be described with reference to FIGS. 22 and 23A through 23D. FIG. 22 is a process flow chart illustrating an example of a method of forming a semiconductor device according to some example embodiments, and FIGS. 23A through 23D are cross-sectional views illustrating an example of a method of forming a semiconductor device according to some example embodiments.

Figure 23A:
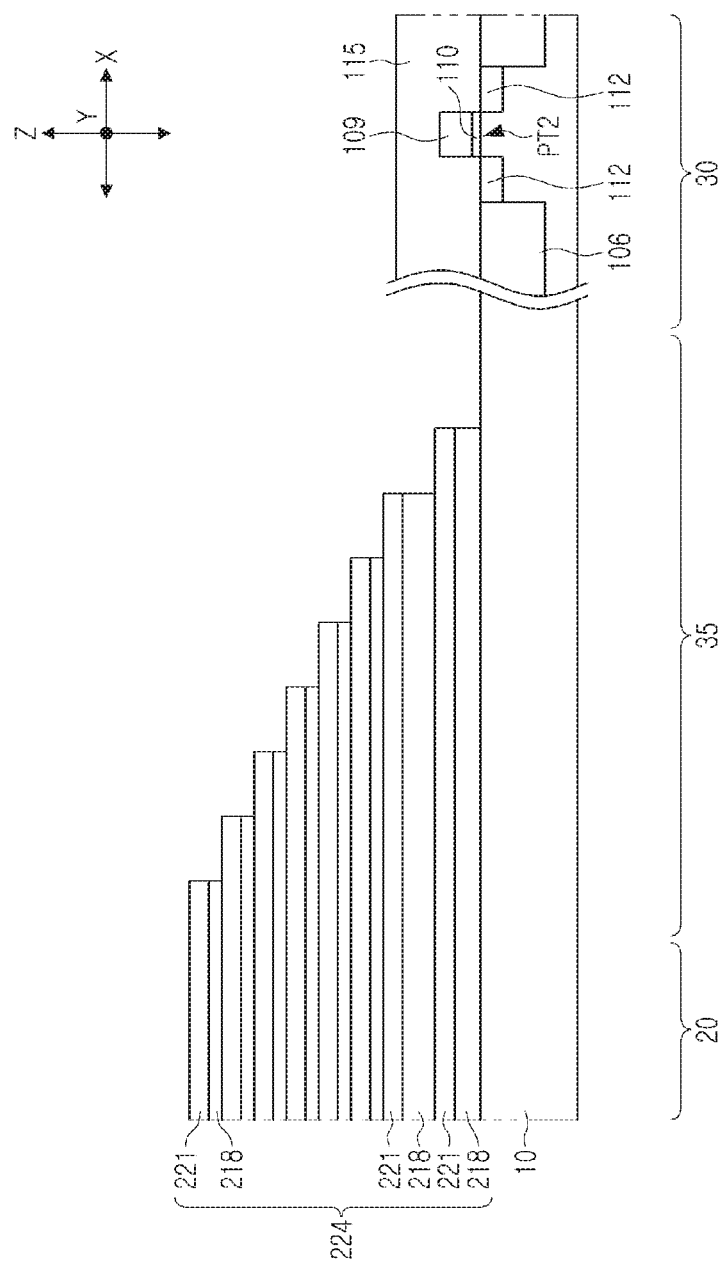
FIGS. 23A through 23D are cross-sectional views illustrating an example of a method of forming a semiconductor device according to some example embodiments.

Along with FIGS. 13 and 14, with reference to FIGS. 22 and 23A, a peripheral circuit may be formed on a semiconductor substrate 10 (S110). The substrate 10 may have a first region 20, a second region 30, and a middle region 35 disposed between the first region and the second region. The peripheral circuit may be formed in the second region 30 of the substrate 10. The peripheral circuit may include a lower peripheral transistor PT2. An interlayer insulating layer 115 covering the peripheral circuit including the lower peripheral transistor PT2 may be provided.

A mold structure 224 including interlayer insulating layers 218 and sacrificial gate layers 221 alternately stacked may be formed on the substrate 10 (S120). End portions of the mold structure 224 may be formed to have a stepped shape in the middle region 35 of the substrate 10.

Figure 23B:
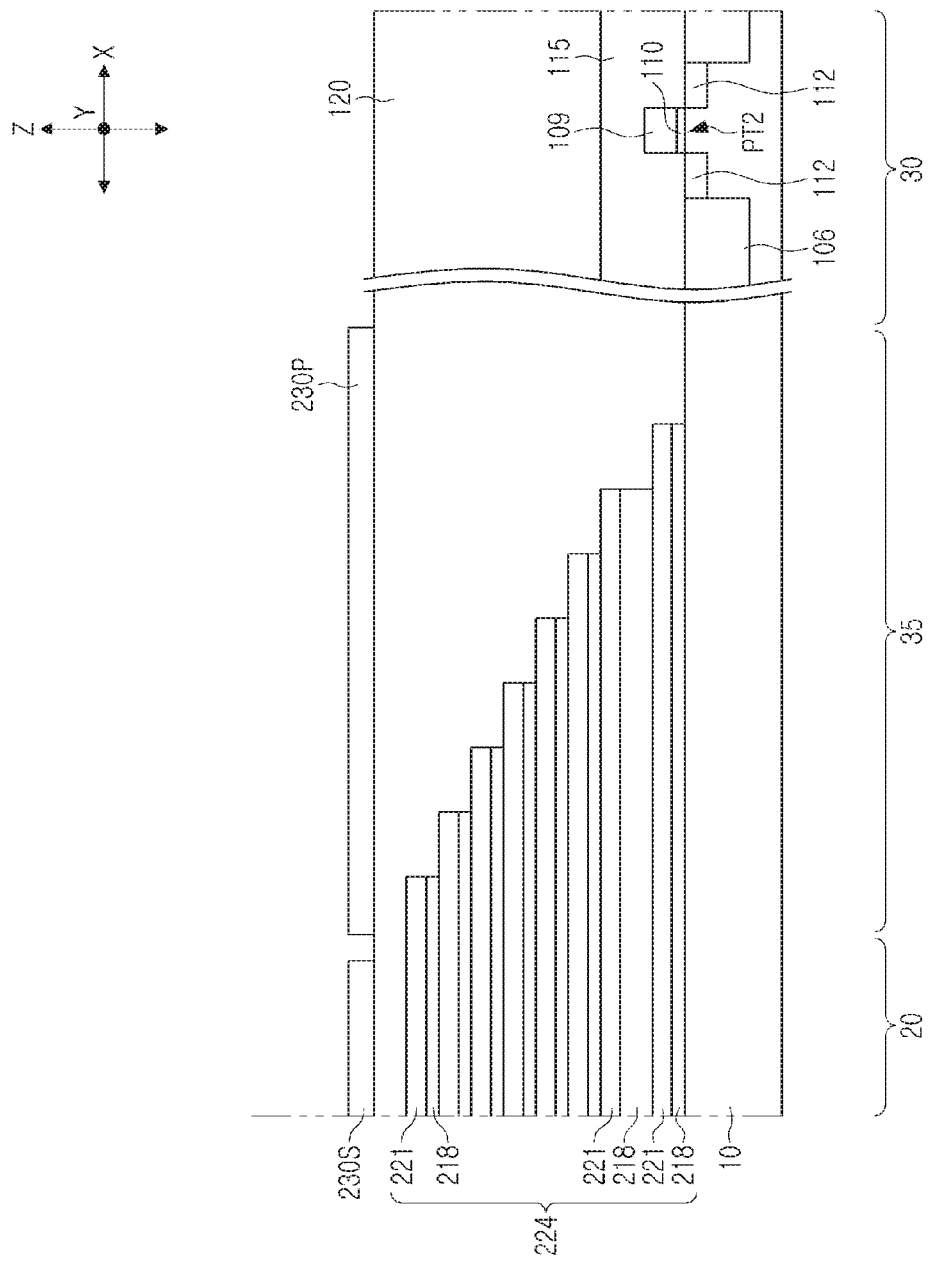

Along with FIGS. 13 and 14, with reference to FIGS. 22 and 23B, an interlayer insulating layer 120 covering the mold structure 224 may be provided.

On the interlayer insulating layer 120, an upper gate electrode 230S and an upper peripheral gate electrode 230P may be formed thereon (S130). The upper gate electrode 230S and the upper peripheral gate electrode 230P may be formed of a conductive material such as polysilicon, or the like.

Figure 23C:
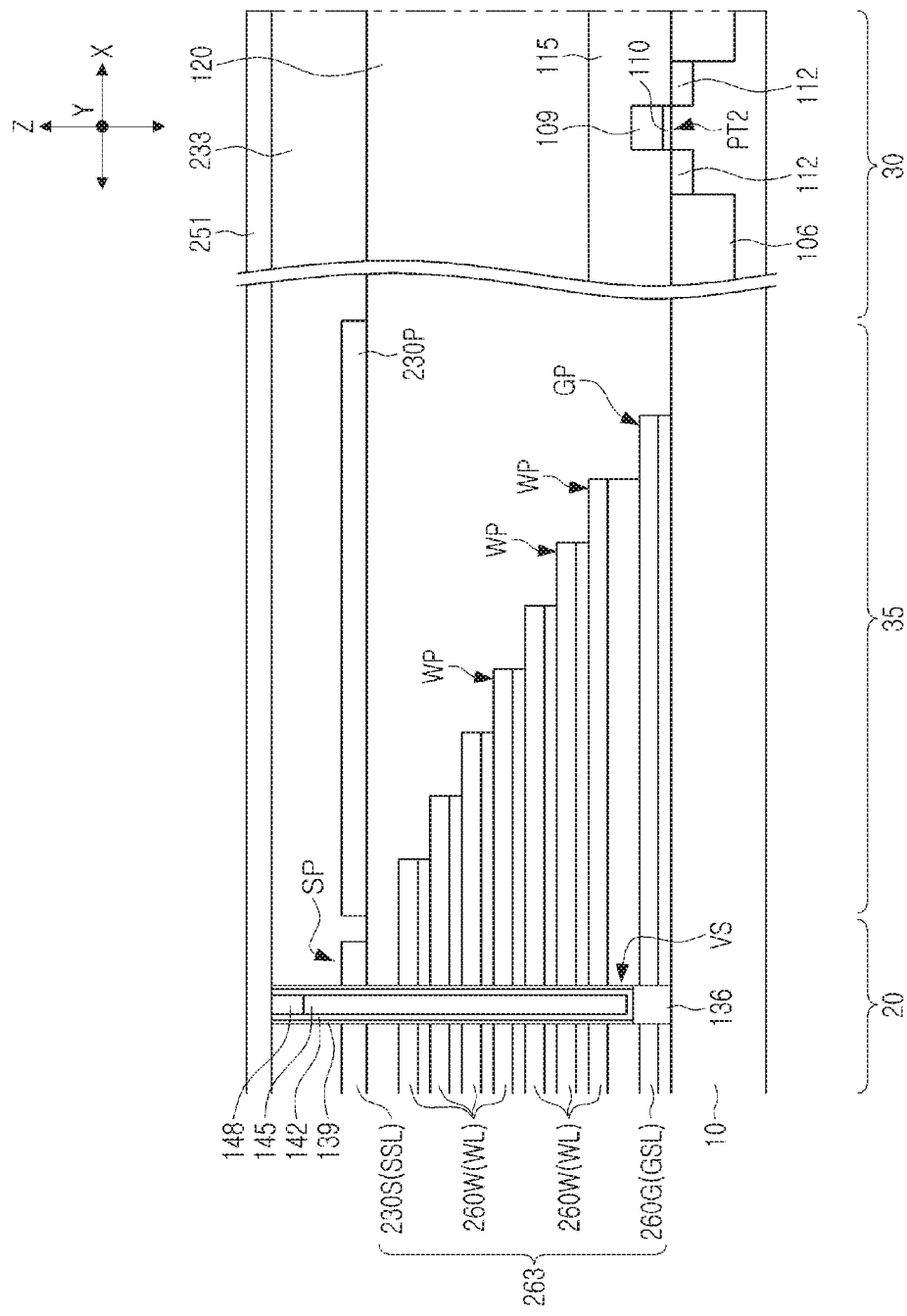

Along with FIGS. 13 and 14, with reference to FIGS. 22 and 23C, an interlayer insulating layer 233 covering the upper gate electrode 230S and the upper peripheral gate electrode 230P may be provided.

On the first region 20 of the substrate 10, vertical structures VS may be formed thereon. The vertical structures VS may be formed to pass through the interlayer insulating layers 233 and 120 in addition to the mold structure (224 of FIG. 23B). Each of the vertical structures VS may include the semiconductor pattern 136, the core pattern 145, the drain 148, the channel layer 142, and the dielectric structure 139, the same as illustrated in FIG. 21A. An interlayer insulating layer 251 covering the vertical structures VS may be provided.

Next, a gate replacement process for replacing the sacrificial gate layers (221 of FIG. 23B) with gate electrodes 260W and 260G is performed to form gate electrodes 260W and 260G in addition to pad regions WP and GP (S140).

Performing the gate replacement process may include forming separation openings extended in one direction X, passing through the mold structure (224 of FIG. 23B), and exposing the substrate 10, exposing side surfaces of the sacrificial gate layers (221 of FIG. 23B), removing the sacrificial gate layers (221 of FIG. 23B), which is exposed, to form empty spaces, forming gate electrodes 260W and 260G in addition to pad regions WP and GP, inside the empty spaces, which are formed, forming impurity regions (152 of FIG. 3B) inside a substrate 10 exposed by the separation openings, and forming separation spacers (154 of FIG. 3B) in addition to isolation patterns (156 of FIG. 3B), filling the separation openings.

Figure 23D:
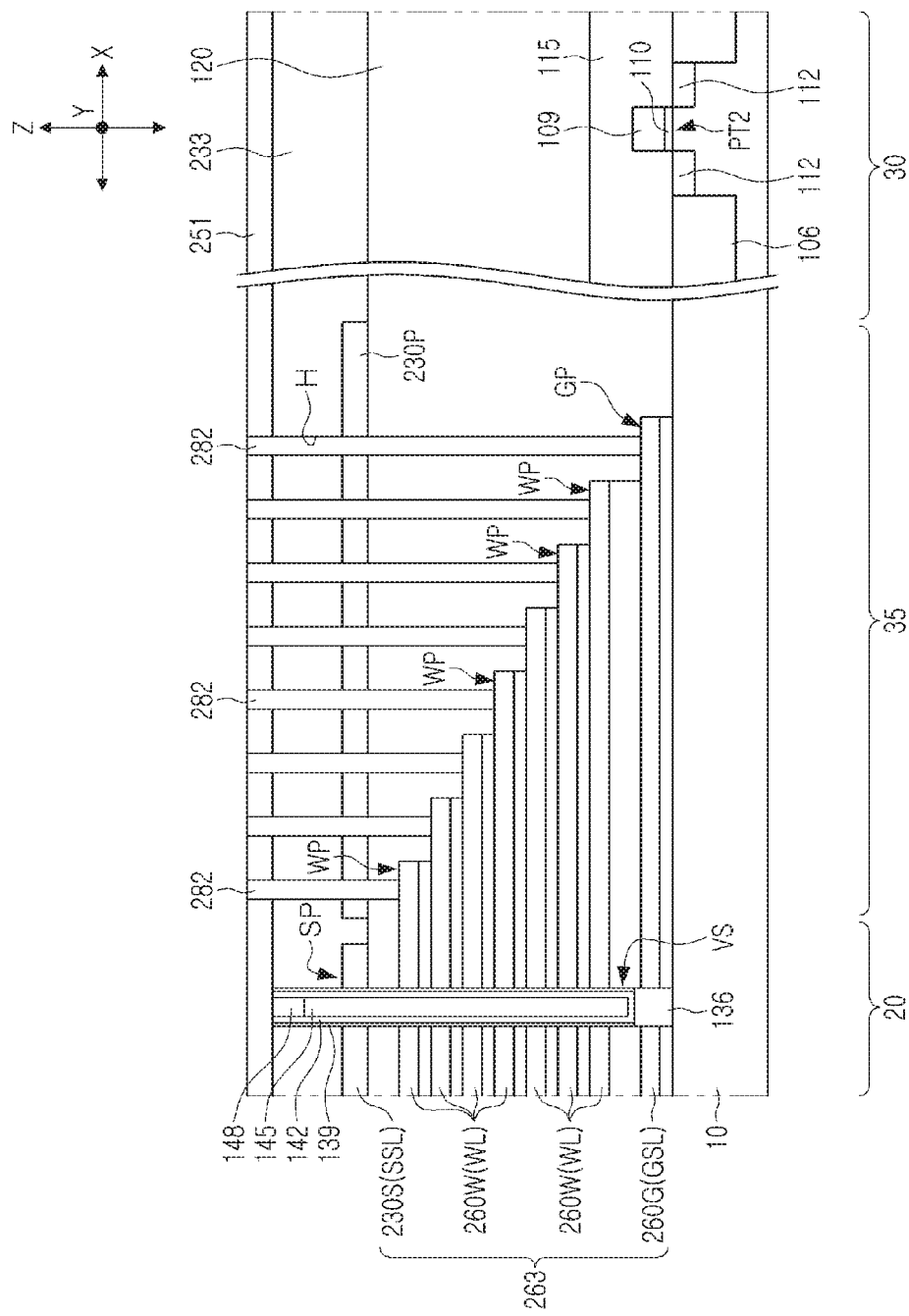

Along with FIGS. 13 and 14, with reference to FIGS. 22 and 23D, holes H passing through the upper peripheral gate electrode 230P may be provided (S150). The holes H may expose the pad regions WP and GP of the gate electrodes 260W and 260G and the upper peripheral gate electrode 230P. An upper peripheral gate dielectric layer may be formed on the upper peripheral gate electrode 230P exposed by the holes H (S160). The peripheral gate dielectric layer may be provided as one of peripheral gate dielectric layers (180 of FIG. 5A and 180' of FIG. 6) illustrated in FIGS. 5A and 6.

Body patterns 282 may be formed inside the holes H (S170). Forming the body patterns 282 may include forming N-type polysilicon filling the holes H, and performing a channel ion implantation process to convert polysilicon opposing the upper peripheral gate electrode 230P to have P-type conductivity. In addition, forming the body patterns 282 may include performing an additional ion implantation process to form high-concentration N-type polysilicon inside the holes H located on a level higher than that of the upper peripheral gate electrode 230P.

In a different example, forming the body patterns 282 may include, after forming lower contact plugs (269 of FIG. 16) partially filling the holes H, forming polysilicon filling a remaining portion of the holes H on the lower contact plugs (269 of FIG. 16). Upper surfaces of the lower contact plugs 269 may be formed on a level lower than that of the upper peripheral gate electrode 230P.

With reference to FIGS. 13 and 14, wirings 191B, 190S, 190W, 190G, 191G, and 190P may be formed (S180). The wirings 191B, 190S, 190W, 190G, 191G, and 190P may be formed using a damascene process. While the wirings 191B, 190S, 190W, 190G, 191G, and 190P are formed, plugs 284, 285a, 285b, and 285c below the wirings 191B, 190S, 190W, 190G, 191G, and 190P may be also formed.

As described above, according to example embodiments, as some circuits of a row decoder circuit region 3 electrically connected to word lines WL of a memory cell array 2, for example, pass transistors PT1 are disposed above pad regions WP of word lines WL, a flat area in which the pass transistors PT1 are located in a semiconductor substrate 10 may be reduced. Thus, integration of a semiconductor device 1 may be improved.

As set forth above, according to some example embodiments of inventive concepts, a portion of a peripheral circuit may be disposed on pad regions of word lines, thereby improving integration of a semiconductor device.

While some example embodiments have been shown and described above, it will be apparent to those skilled in the art that modifications and variations could be made without departing from the scope of inventive concepts, as defined by the appended claims.

What is claimed is:

1. A semiconductor device, comprising:
a semiconductor substrate;
a plurality of cell gate electrodes on the semiconductor substrate, the plurality of cell gate electrodes being stacked on top of each other and extending in a direction parallel to a surface of the semiconductor substrate, the plurality of cell gate electrodes including pad regions arranged in a stepped manner at end portions of the plurality of cell gate electrodes;
vertical structures on the semiconductor substrate, the vertical structures passing through the plurality of cell gate electrodes, and the vertical structures respectively including a channel layer; and
upper peripheral transistors on the semiconductor substrate,
the upper peripheral transistors including an upper peripheral gate electrode at a level higher than a level of the plurality of cell gate electrodes, body patterns passing through the upper peripheral gate electrode and being electrically connected to the pad regions, and gate dielectric layers between the upper peripheral gate electrode and the body patterns.

2. The semiconductor device of claim 1, wherein a distance between the upper peripheral gate electrode and a surface of the semiconductor substrate is greater than a distance between upper surfaces of the vertical structures and the surface of the semiconductor substrate.

3. The semiconductor device of claim 1, further comprising:
lower contact plugs on the pad regions,
wherein the lower contact plugs and the pad regions contact each other to form an interface.

4. The semiconductor device of claim 3, wherein
upper surfaces of the lower contact plugs are coplanar with each other, and
the upper surfaces of the lower contact plugs are at a level higher than a level of upper surfaces of the vertical structures.

5. The semiconductor device of claim 3, further comprising:

a connection pattern on the lower contact plugs,
wherein the connection pattern electrically connects the body patterns and the lower contact plugs to each other.

6. The semiconductor device of claim 1, wherein
the body patterns respectively include a lower impurity region and an upper impurity region having N-type conductivity, and a channel region between the lower impurity region and the upper impurity region and having P-type conductivity, and
the channel region opposes the upper peripheral gate electrode.

7. The semiconductor device of claim 1, further comprising:
an upper gate electrode on the plurality of cell gate electrodes.

8. The semiconductor device of claim 7, wherein the upper gate electrode and the upper peripheral gate electrode are coplanar.

9. The semiconductor device of claim 7, wherein a material of the upper gate electrode is the same as a material of the upper peripheral gate electrode.

10. The semiconductor device of claim 9, wherein the material of the upper gate electrode is different than a material of the plurality of cell gate electrodes.

11. A semiconductor device, comprising:
a semiconductor substrate;
a memory cell array on the semiconductor substrate, the memory cell array including first word lines and vertical structures, the first word lines being stacked on top of each other in a direction perpendicular to a surface of the semiconductor substrate, the vertical structures passing through the first word lines,
the vertical structures respectively including a channel layer and a drain connected to an upper region of the channel layer,
the first word lines including stepped-first pad regions at end portions of the first word lines, the stepped-first pad regions extending in a direction parallel to the surface of the semiconductor substrate; and
a peripheral circuit on the semiconductor substrate, the peripheral circuit including an upper circuit electrically connected to the stepped-first pad regions,
the upper circuit including an upper peripheral gate electrode at a level higher than a level of the first word lines,
the upper circuit including body patterns passing through the upper peripheral gate electrode and electrically connected to the stepped-first pad regions, and
the upper circuit including an upper gate dielectric layer between the upper peripheral gate electrode and the body patterns.

12. The semiconductor device of claim 11, further comprising:
second word lines on the semiconductor substrate, wherein
the first word lines and the second word lines are coplanar
the second word lines include stepped-second pad regions at end portions of the second word lines, and
the stepped-second pad regions extend the direction parallel to the surface of the semiconductor substrate.

13. The semiconductor device of claim 12, further comprising:
first lower contact plugs on the stepped-first pad regions;
second lower contact plugs on the stepped-second pad regions; and
connection patterns connected to a first lower contact plug and a second lower contact plug, wherein the first lower contact plugs include the first lower contact plug,
the second lower contact plugs include the second lower contact plug,
a height of the first lower contact plug is the same as a height of the second lower contact plug, and
the body patterns are on the connection patterns.

14. The semiconductor device of claim 12, further comprising:
a string select line on the first word lines, wherein
the string select line and the upper peripheral gate electrode are coplanar.

15. The semiconductor device of claim 14, wherein
the peripheral circuit further includes a lower circuit,
the lower circuit does not overlap the first word lines and the stepped-first pad regions,
the lower circuit is closer to the semiconductor substrate than the upper circuit, and
the lower circuit is electrically connected to the string select line.

16. A semiconductor device, comprising:
a substrate;
a plurality of word lines stacked on top of each other on the substrate and spaced apart from each other in a vertical direction compared to a top surface of the substrate, a width of the plurality of word lines decreasing as a distance of the plurality of word lines from the top surface of the substrate is increased, the plurality of word lines including stepped-pad regions at end portions of the plurality of word lines;
a plurality of vertical structures extending through a portion of the plurality of word lines in the vertical direction;
lower contact plugs on the stepped-pad regions of the plurality of word lines, the lower contact plugs extending in the vertical direction;
upper peripheral transistors on the lower contact plugs; and
an upper peripheral wiring on the upper peripheral transistors.

17. The semiconductor device of claim 16, wherein
a level of an upper surface of the lower contact plugs above the upper surface of the substrate is greater than a level of an upper surface of the plurality of vertical structures above the upper surface of the substrate; and
the plurality of vertical structures respectively include a channel layer.

18. The semiconductor device of claim 16, wherein the upper peripheral transistors include:
an upper peripheral gate electrode extending parallel to the top surface of the substrate; and
body patterns passing through the upper peripheral gate electrode; and
gate dielectric layers between the upper peripheral gate electrode and the body patterns.

19. The semiconductor device of claim 16, further comprising:
a lower peripheral transistor on the substrate; and
a lower peripheral contact plug connected to an impurity region of the lower peripheral transistor; and
a peripheral wiring on the lower peripheral contact plug, wherein
the lower peripheral transistor is spaced apart from the plurality of word lines, and
a level of an upper surface of the lower peripheral transistor above the upper surface of the substrate is less than a level of an upper surface of the plurality of vertical structures above the upper surface of the substrate.

20. The semiconductor device of claim 16, wherein
a level of an upper surface of the lower contact plugs above the upper surface of the substrate is less than a level of an upper surface of the plurality of vertical structures above the upper surface of the substrate; and
the plurality of vertical structures respectively include a channel layer.

* * * * *